(12) United States Patent
Ishii et al.

(10) Patent No.: US 12,463,056 B2
(45) Date of Patent: Nov. 4, 2025

(54) WIRING BOARD MANUFACTURING METHOD AND WIRING BOARD

(71) Applicant: TOPPAN INC., Tokyo (JP)

(72) Inventors: Tomoyuki Ishii, Tokyo (JP); Takehisa Takada, Tokyo (JP); Yuki Umemura, Tokyo (JP)

(73) Assignee: TOPPAN INC., Tokyo (JP)

( * ) Notice: Subject to any disclaimer, the term of this patent is extended or adjusted under 35 U.S.C. 154(b) by 162 days.

(21) Appl. No.: 18/371,268

(22) Filed: Sep. 21, 2023

(65) Prior Publication Data

US 2024/0021439 A1 Jan. 18, 2024

Related U.S. Application Data

(63) Continuation of application No. PCT/JP2022/014307, filed on Mar. 25, 2022.

(30) Foreign Application Priority Data

Mar. 26, 2021 (JP) ................................. 2021-052626
Mar. 26, 2021 (JP) ................................. 2021-052640

(51) Int. Cl.
*H01L 21/48* (2006.01)
*H01L 23/498* (2006.01)
(Continued)

(52) U.S. Cl.
CPC ...... *H01L 21/486* (2013.01); *H01L 23/49827* (2013.01); *H01L 25/16* (2013.01);
(Continued)

(58) Field of Classification Search
CPC .............................. H01L 21/486; H10D 86/85
See application file for complete search history.

(56) References Cited

U.S. PATENT DOCUMENTS

| 9,184,135 B1 | 11/2015 | Mobley et al. |
| 2002/0084031 A1 | 7/2002 | Doh |

(Continued)

FOREIGN PATENT DOCUMENTS

| JP | S54-126215 A | 10/1979 |
| JP | 2000-061667 A | 2/2000 |

(Continued)

OTHER PUBLICATIONS

European Extended Search Report issued in corresponding European Patent Application No. 22775818.2 dated Sep. 9, 2024 (11 pages).

(Continued)

*Primary Examiner* — Scott Bauer
(74) *Attorney, Agent, or Firm* — Foley & Lardner LLP

(57) ABSTRACT

A wiring board manufacturing method including a step A of forming a laser-modified portion in a glass substrate by applying laser light to the glass substrate from a first surface toward an opposite surface thereof; a step B of forming, on the first surface of the glass substrate, a first surface wiring layer including a hydrofluoric acid resistant metal film and a copper layer; a step C of etching a surface of the glass substrate opposite to the first surface to form a through via in the laser-modified portion and form a second surface of the glass substrate, the second surface being an opposite surface to the first surface; a through via treatment step D of removing an etching residue of glass adhered to the hydrofluoric acid resistant metal film; and a step E of forming a through electrode in the through via.

17 Claims, 19 Drawing Sheets

(51) Int. Cl.
  *H01L 25/16* (2023.01)
  *H10D 86/85* (2025.01)
  *H01L 23/00* (2006.01)
(52) U.S. Cl.
  CPC ............ *H10D 86/85* (2025.01); *H01L 24/16* (2013.01); *H01L 2224/16227* (2013.01); *H01L 2224/16237* (2013.01)

(56) References Cited

U.S. PATENT DOCUMENTS

| | | | | |
|---|---|---|---|---|
| 2015/0289387 | A1* | 10/2015 | Mirkovic | C25D 3/38 205/103 |
| 2016/0064318 | A1* | 3/2016 | Inagaki | H01L 21/486 216/13 |
| 2016/0242299 | A1* | 8/2016 | Yoshida | H05K 3/4652 |
| 2022/0002622 | A1* | 1/2022 | Takahashi | C23F 1/02 |

FOREIGN PATENT DOCUMENTS

| | | |
|---|---|---|
| JP | 2001-105398 A | 4/2001 |
| JP | 2002-059557 A | 2/2002 |
| JP | 2013-119512 A | 6/2013 |
| JP | 2019-089082 A | 6/2019 |
| JP | 2021-166257 A | 10/2021 |
| WO | WO-2019/235617 A1 | 12/2019 |

OTHER PUBLICATIONS

International Searching Authority, "International Search Report," issued in connection with International Patent Application No. PCT/JP2022/014307, dated Jun. 21, 2022.

International Searching Authority, "Written Opinion," issued in connection with International Patent Application No. PCT/JP2022/014307, dated Jun. 21, 2022.

* cited by examiner

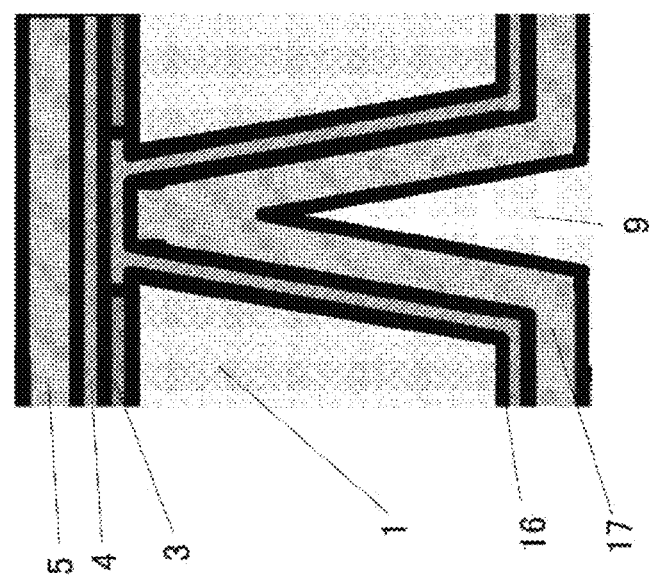
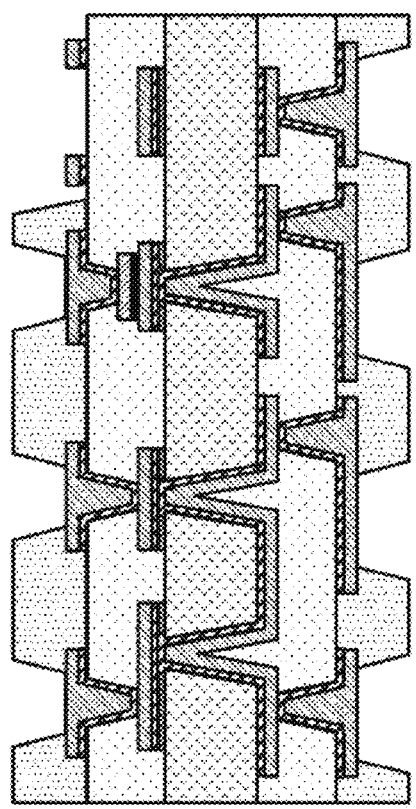
FIG. 5A(a)
FIG. 5A(b)

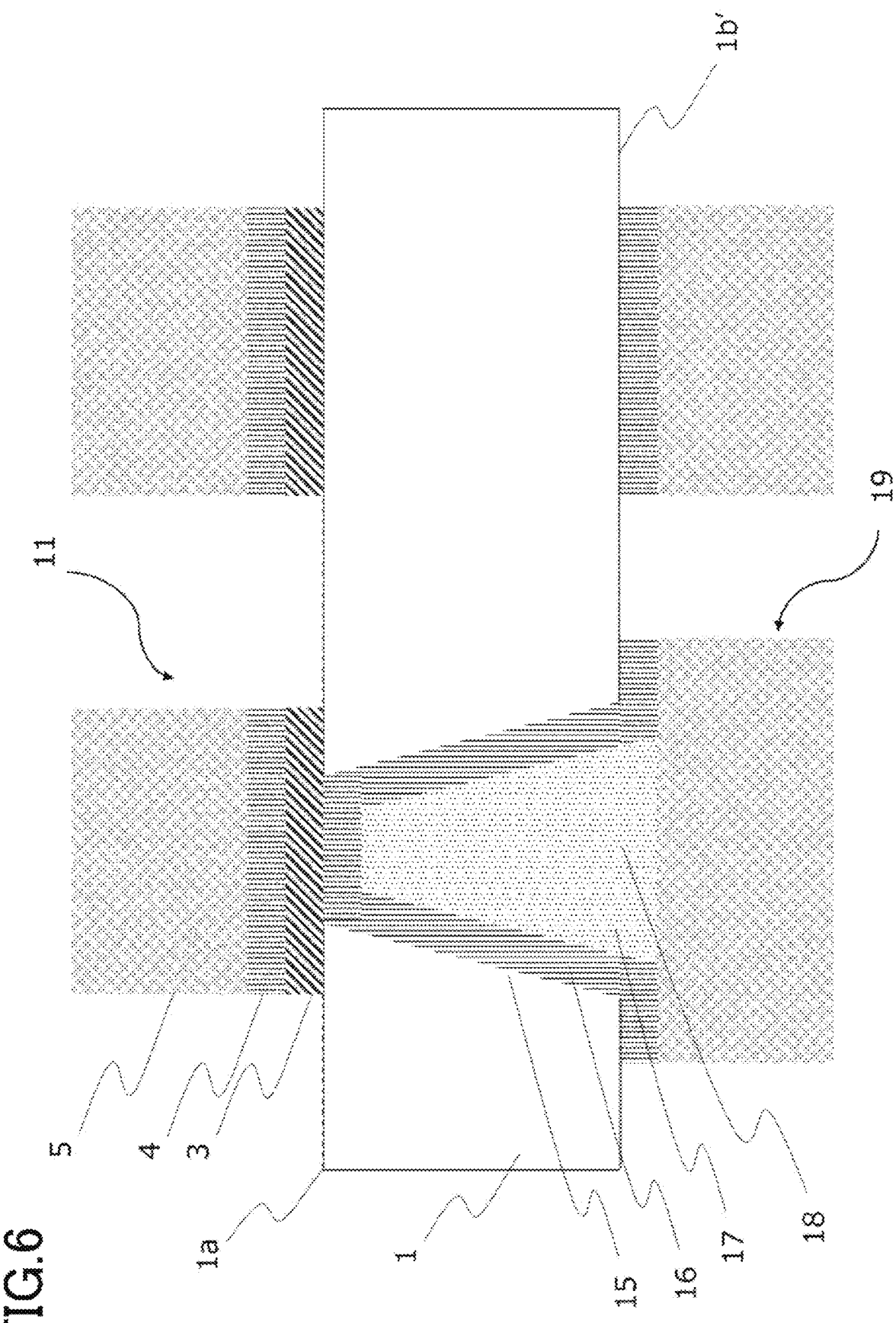

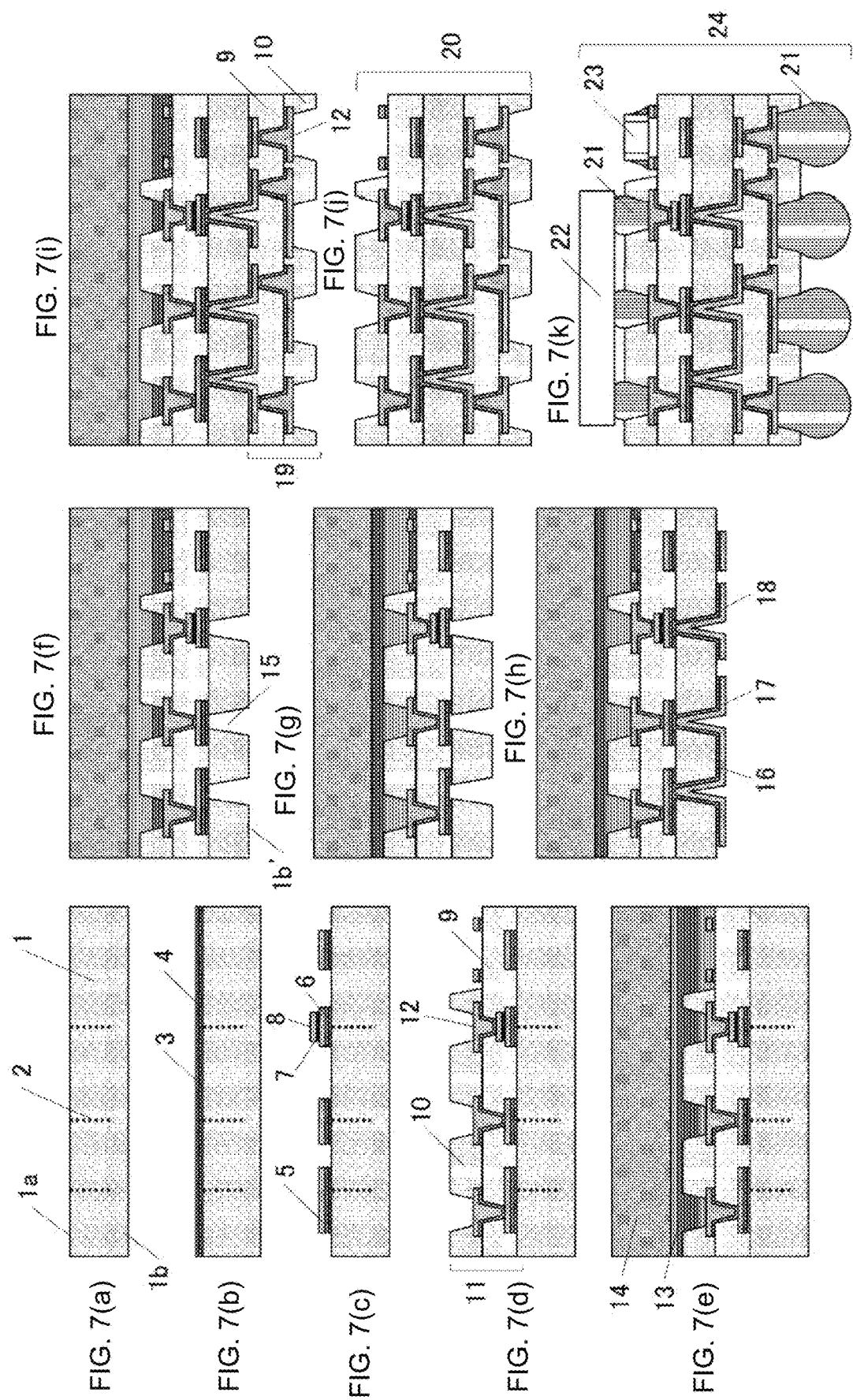

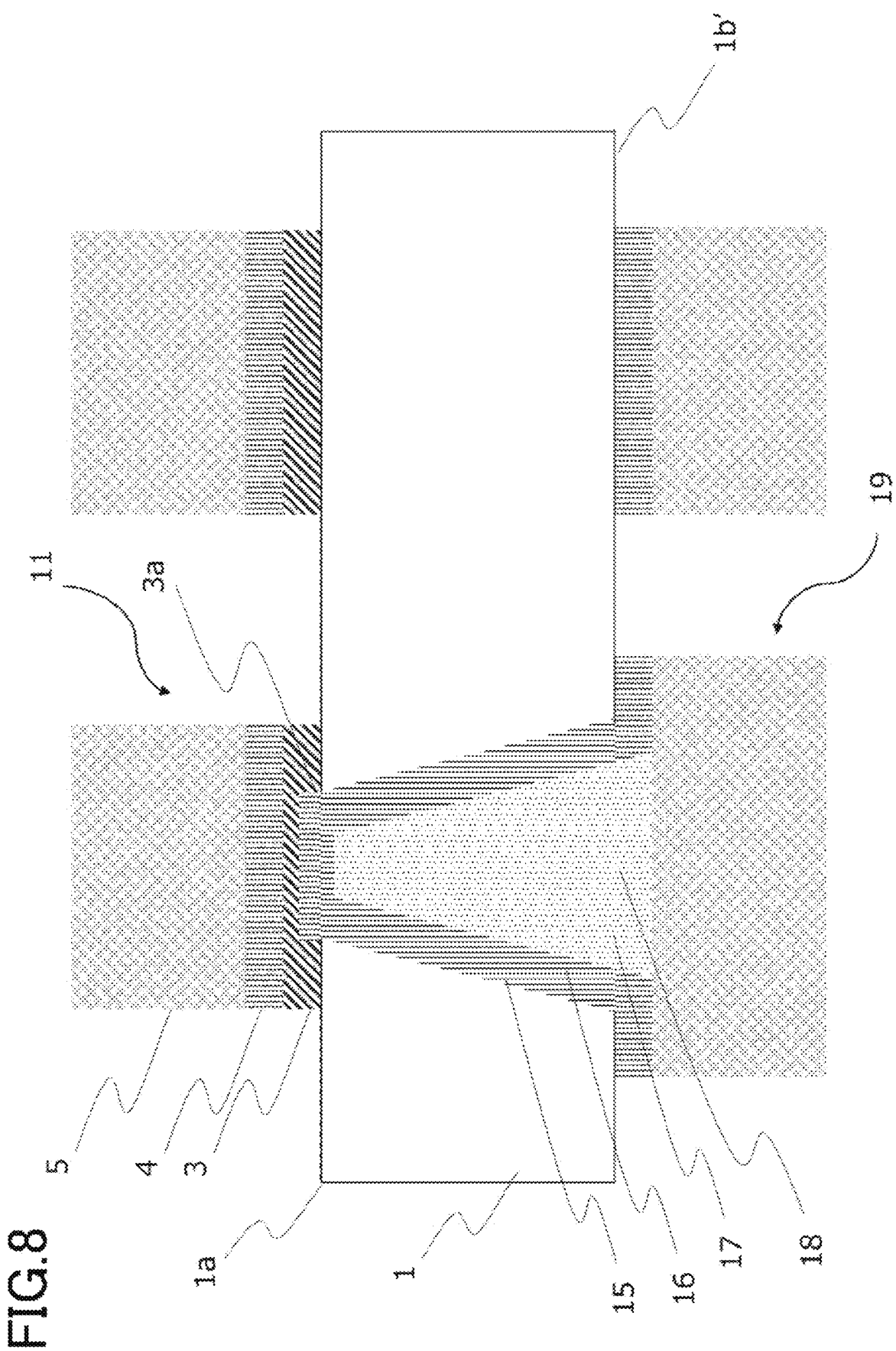

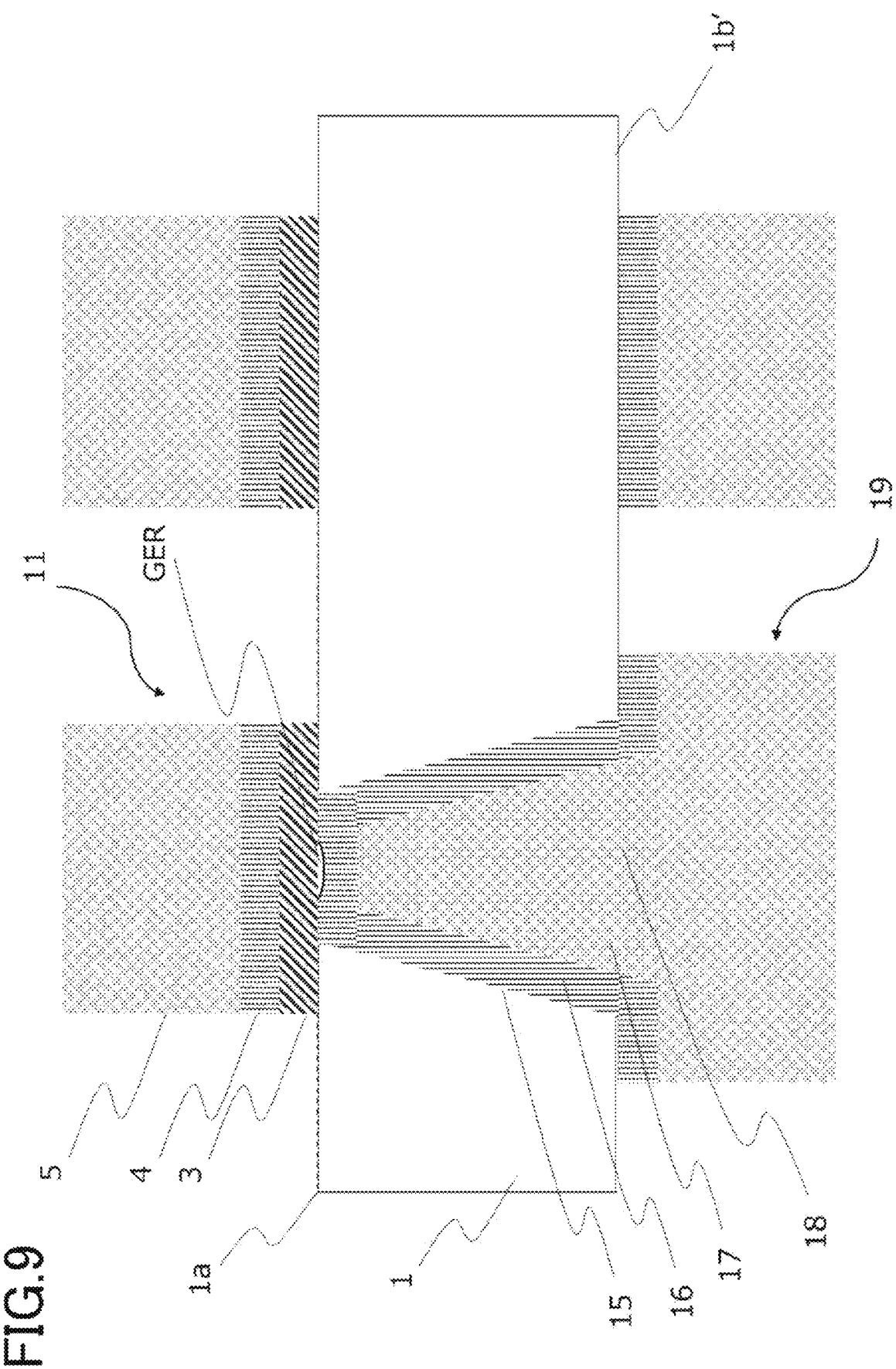

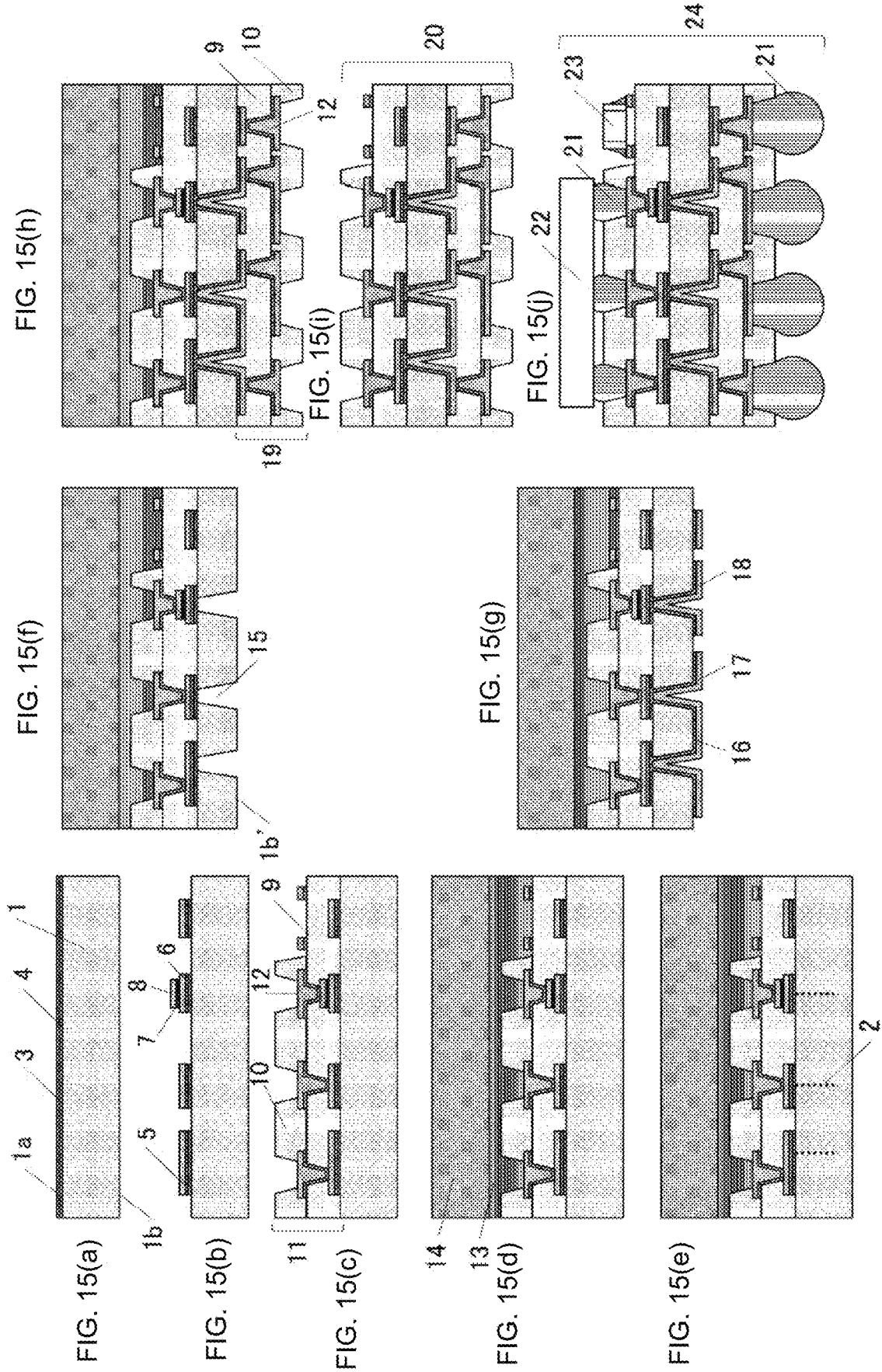

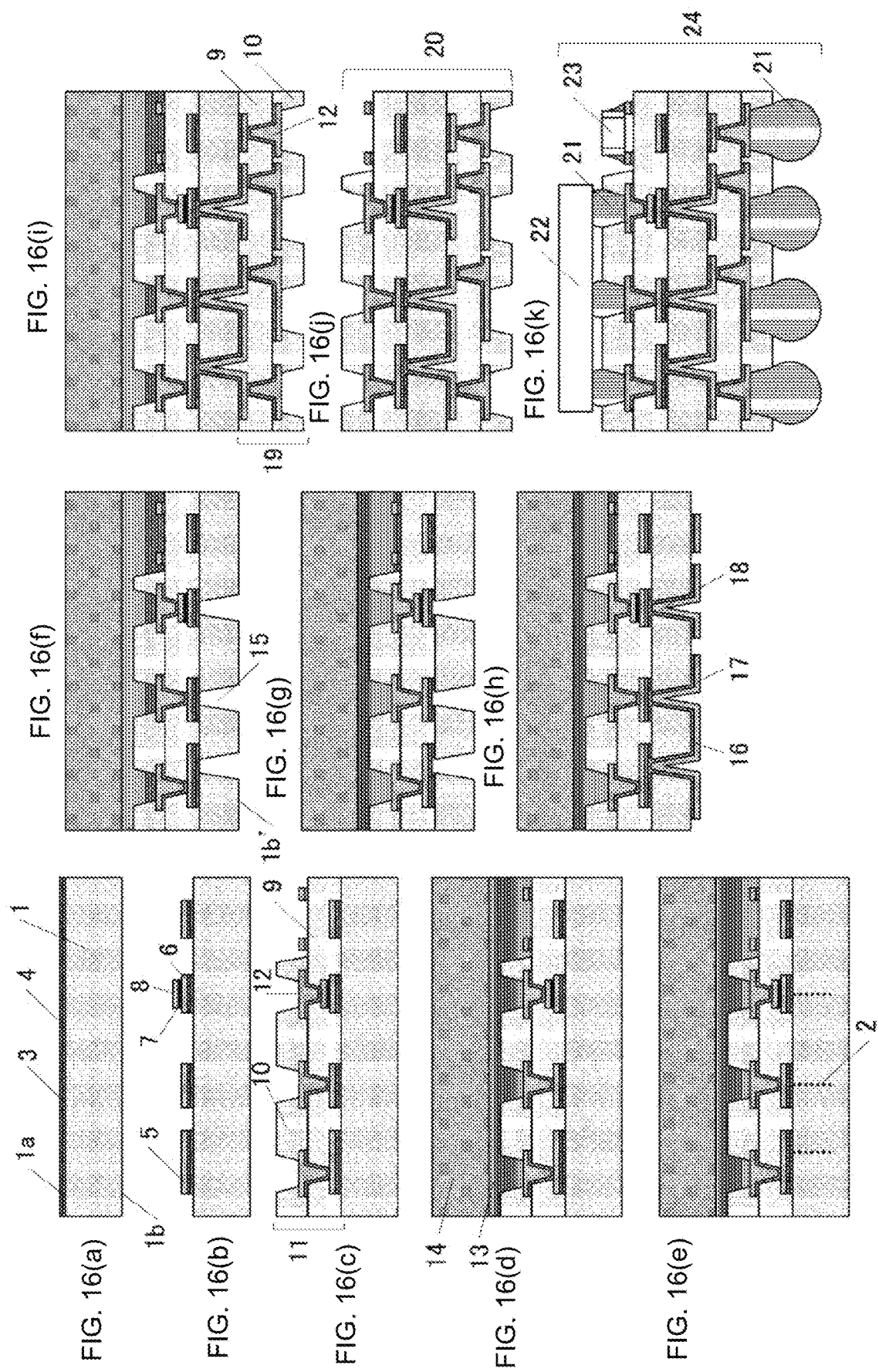

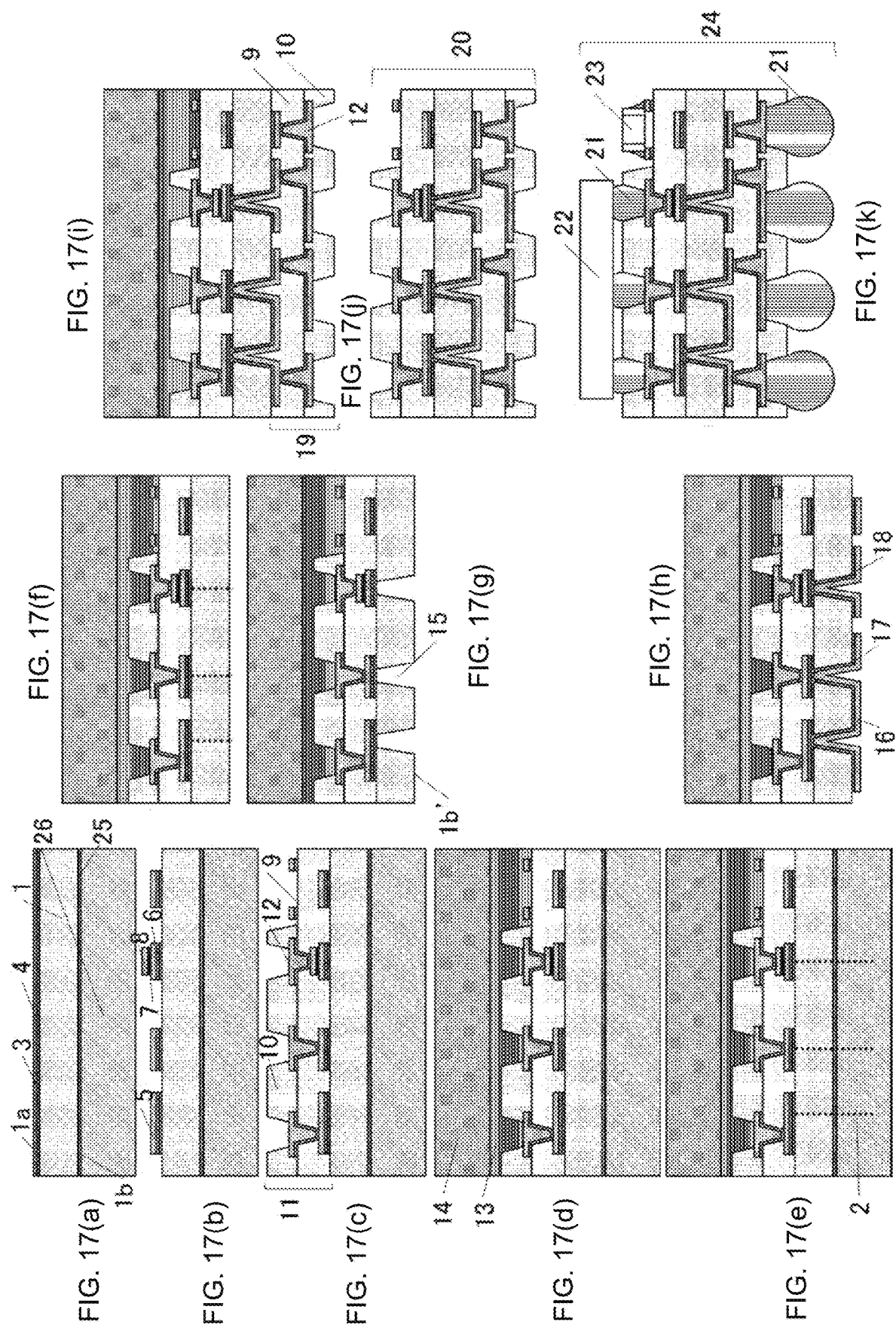

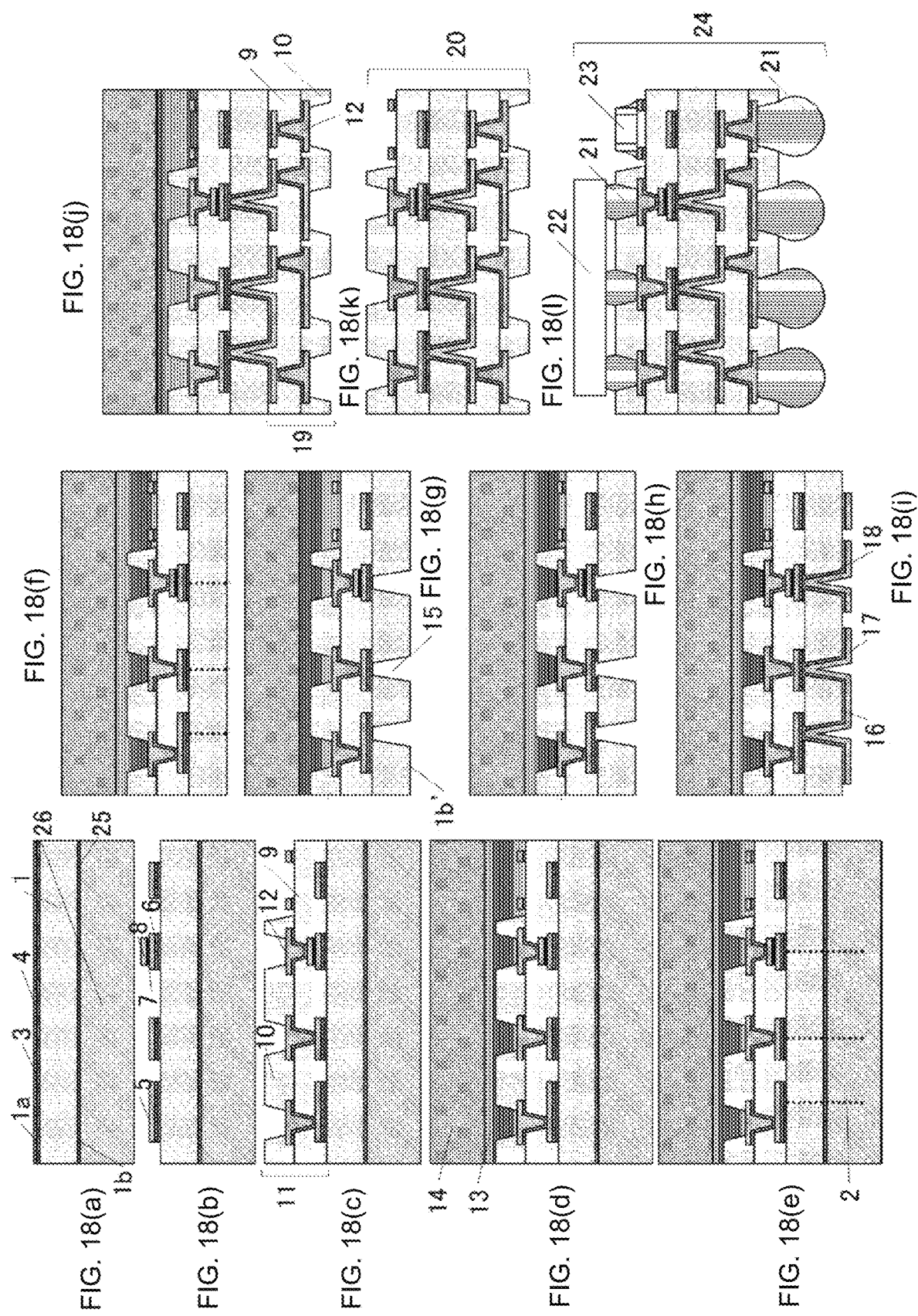

WIRING BOARD MANUFACTURING METHOD AND WIRING BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2022/014307, filed on Mar. 25, 2022, which is based upon and claims the benefit of priority to Japanese Patent Application Nos. 2021-052626 and 2021-052640, both filed on Mar. 26, 2021, the disclosures of which are incorporated herein by reference in their entirety.

TECHNICAL FIELD

The present invention relates to wiring board manufacturing methods and wiring boards.

BACKGROUND

Known examples of large-scale integration (LSI) packaging technologies include a packaging technology that uses through silicon vias (TSVs) (referred to as TSV technology). Silicon substrates including through vias are widely used as interposers, for example. Interposers are substrates that connect substrates having different terminal-to-terminal distances such as printed boards and integrated circuits (ICs) to which different design rules of wiring are applied.

However, silicon substrates are costly and furthermore, since silicon itself is a semiconductor, an insulation process is required for the through vias. Specifically, in the TSV technology, the insulation process needs to be performed after through vias are formed in silicon substrates, which is problematic in that the cost for substrates increases. In view of this, for example, a glass substrate with through vias that is a low-cost, large-area glass substrate with through glass vias (TGVs) has gained attention in order to reduce the cost for interposers.

When using the glass substrate with through vias, through vias need to be formed in a glass substrate in the TGV technology. Known examples of the technique for forming through vias in a glass substrate include the technique of forming through vias by YAG pulsed laser irradiation as disclosed in Patent Literature (PTL) 1.

Patent Literature 2 discloses a method for forming tiny vias in a photosensitive glass substrate. In the method disclosed in Patent Literature 2, a photomask is positioned in place on the photosensitive glass substrate, and ultraviolet light is emitted thereto to form a latent image. Next, a heating process is performed on the photosensitive glass substrate so that the latent image is crystallized. Subsequently, pre-machining holes smaller than the latent image are formed with laser light at the center of a portion on which the later image has been formed. Next, etching is performed using hydrogen fluoride so that crystallized portion is selectively etched, and thus the vias are formed.

Patent Literature 3 discloses a method for forming vias in plate glass from both sides of the plate glass using a pair of upper and lower coaxial core drills that face each other.

Meanwhile, Patent Literature 4 discloses a method for embedding an LC filter composed of an inductor and a capacitor into a glass substrate. The capacitor has, as one example, a structure called MIM (metal-insulator-metal) in which a metal layer, a dielectric layer, and a metal layer are stacked parallel to the multilayer structure of a wiring board. The inductor can take various forms. For example, a coil may be formed in a spiral form by machining a conductor layer of a multilayer wiring board as with other wires, or a coil spirally wound around an insulator layer may be formed by providing wires on each of two conductor layers sandwiching the insulator layer, further forming through vias in the insulator layer, and connecting the wires on both the conductor layers and the through vias. The LC filter, which is also called an LC frequency filter, uses a resonance phenomenon of the inductor (L) and the capacitor (C) in combination to pass electrical signals with a specific frequency to a circuit and block electrical signals with the other frequencies, and may include the functions of a bandpass filter, a low-pass filter, a high-pass filter, and a diplexer.

CITATION LIST

[Patent Literature] PTL 1: JP 2000-61667 A; PTL 2: JP 2001-105398 A; PTL 3: JP S54-126215 A; PTL 4: JP 2021-166257 A; PTL 5: WO 2019/235617.

SUMMARY OF THE INVENTION

Technical Problem

There is a possibility that the formation of through vias in a glass substrate may cause the glass substrate to have reduced mechanical strength. In particular, when glass having a thickness of 300 μm or less is used, the reduced mechanical strength may lead to glass cracking in a transport step for forming a conductive part such as a circuit, and thus it is difficult to handle the glass substrate.

In the TSV technology, approaches such as the Bosch process, in which dry etching is used, have been established as a method for forming through vias in a silicon substrate. However, the formation of through vias in a glass substrate by dry etching is time consuming and difficult in practice. In particular, the formation of through vias in a glass substrate having a thickness of 300 μm or less and the application thereof to substrates for electronic devices represented by interposers are technically very difficult and are difficult in practice.

In this regard, Patent Literature 5 discloses a method for more easily manufacturing a glass device with a glass core that has a glass thickness of 300 μm or less by forming through vias and reducing the thickness of a glass substrate at the same time by etching after forming wires on one side of the glass substrate. With the technique disclosed in Patent Literature 5, the thickness of the glass is reduced and the through vias are formed at the same time in the state where the glass substrate is supported on a glass carrier, leading to better handleability of the glass substrate in the formation of a circuit or the like on the glass substrate. Therefore, the glass device with through vias that includes a glass substrate having a thickness of 300 μm or less can be stably formed.

With the above-described manufacturing method, a hydrofluoric acid resistant metal film (for example, a chromium, nickel, or nickel-chromium film) serves as an etching stopper layer so that a hydrogen fluoride solution and a seed layer of wiring formed on glass do not come into contact with each other, which protects the seed layer from corrosion, and that the shapes, sizes, etc., of through vias in the hydrofluoric acid resistant metal film become more stable, which is an advantageous effect, but there are the following problems.

(1) After etching of the glass using the hydrogen fluoride solution, glass etching residues that have failed to be removed with the hydrogen fluoride solution may adhere to the hydrofluoric acid resistant metal film. The etching residues are scattered on the hydrofluoric acid resistant metal film; when the seed layer is formed with the residues left, the adhesion between the hydrofluoric acid resistant metal film and the seed layer may be reduced, which may lead to a reduction in the reliability of connection via the through vias.

(2) Furthermore, since the through vias are electrically connected via the etching residues, the electrical resistance of electrically connected portions of through vias increases, and the transmission characteristics, the electrical characteristics, etc., of wiring boards may be degraded, and the transmission characteristics, the electrical characteristics, etc., of capacitors connected to the through vias, inductors formed using the through vias, and LC filters composed of the capacitors and the inductors may be degraded, for example.

(3) The material of the hydrofluoric acid resistant metal film may be chromium, nickel, or nickel-chromium, for example, which has a higher resistivity than the resistivity of copper that is the material of the seed layer, meaning that the hydrofluoric acid resistant metal film itself is a factor in degradation of the transmission characteristics, the electrical characteristics, etc., of wires connected to the through vias, capacitors connected to the through vias, inductors formed using the through vias, and LC filters composed of the capacitors and the inductors.

(4) Regarding the adhesion between the hydrofluoric acid resistant metal film and the seed layer, an adhesive layer suitable for the hydrofluoric acid resistant metal film needs to be additionally formed, for example, in order to ensure adhesion, and the number of processes increases accordingly.

The present invention has been conceived in view of the aforementioned problems and has an object to provide: a wiring board manufacturing method in which a wiring board can be manufactured easily at low cost while ensuring good transmission characteristics, good electrical characteristics, etc., of wirings on a glass substrate, capacitors embedded in the glass substrate and connected to through vias, inductors formed using the through vias, and LC filters composed of the capacitors and the inductors; and the wiring board.

Solution to Problem

In order to solve the aforementioned problems, one typical wiring board manufacturing method according to the present invention is achieved by including:
  a step A of forming a laser-modified portion in a glass substrate by applying laser light to the glass substrate from a first surface toward an opposite surface thereof;
  a step B of forming, on the first surface of the glass substrate, a first surface wiring layer including a hydrofluoric acid resistant metal film and a copper layer;
  a step C of etching a surface of the glass substrate opposite to the first surface to form a through via in the laser-modified portion and form a second surface of the glass substrate, the second surface being an opposite surface to the first surface;
  a through via treatment step D of removing an etching residue of glass adhered to the hydrofluoric acid resistant metal film; and
  a step E of forming a through electrode in the through via.

Furthermore, one typical wiring board manufacturing method according to the present invention is achieved by including:
  a step X of bonding a glass substrate to a support;
  a step A of forming a laser-modified portion in the glass substrate and the support by applying laser light thereto from a first surface toward an opposite surface of each of the glass substrate and the support;
  a step B of forming, on the first surface of the glass substrate, a first surface wiring layer including a hydrofluoric acid resistant metal film and a copper layer;
  a step Y of separating and removing the support;
  a step C of etching a surface of the glass substrate opposite to the first surface to form a through via in the laser-modified portion and form a second surface of the glass substrate, the second surface being an opposite surface to the first surface;
  a through via treatment step D of removing an etching residue of glass adhered to the hydrofluoric acid resistant metal film; and
  a step E of forming a through electrode in the through via.

Furthermore, one typical wiring board according to the present invention is achieved by including:
  a first surface wiring layer including a hydrofluoric acid resistant metal film and a copper layer, the hydrofluoric acid resistant metal film and the copper layer being formed on a first surface of a glass substrate;
  a second surface wiring layer formed on a second surface of the glass substrate, the second surface being an opposite surface to the first surface;
  a through via connecting the first surface and the second surface and extending to the hydrofluoric acid resistant metal film; and
  a through electrode formed in the through via and connecting the first surface wiring layer and the second surface wiring layer, wherein
  the hydrofluoric acid resistant metal film is etched from the through via perpendicularly to the first surface or etched from the through via so as to include an undercut.

Advantageous Effects of the Invention

According to the present invention, it is possible to provide: a wiring board manufacturing method in which a wiring board can be manufactured easily at low cost while ensuring good transmission characteristics, good electrical characteristics, etc., of wirings on a glass substrate, capacitors embedded in the glass substrate and connected to through vias, inductors formed using the through vias, and LC filters composed of the capacitors and the inductors; and the wiring board.

Problems, configurations, and advantageous effects other than those described above will be made clear by the following description of embodiments.

BRIEF DESCRIPTION OF THE DRAWINGS

FIG. 5A(a) is a cross-sectional view of one of through electrodes in a conformal form that are formed according to the present embodiment and FIG. 5A(b) is a cross-sectional view of a wiring board formed using the through electrodes.

FIG. 6 is a cross-sectional view of a through via and its surroundings in the wiring board formed according to the present embodiment.

FIGS. 7(a)-7(k) are a set of diagrams illustrating steps in a wiring board manufacturing method according to Embodiment 2A.

FIG. 8 is a cross-sectional view of a through via and its surroundings in the wiring board formed according to Embodiment 2A.

FIG. 9 is a cross-sectional view of a through via and its surroundings in a wiring board according to a comparative example.

FIGS. 15(a)-15(j) are a set of diagrams illustrating steps in a wiring board manufacturing method according to Embodiment 7A.

FIGS. 16(a)-16(k) are a set of diagrams illustrating steps in a wiring board manufacturing method according to Embodiment 5B.

FIGS. 17(a)-17(k) are a set of diagrams illustrating steps in a wiring board manufacturing method according to Embodiment 8A.

FIGS. 18(a)-18(l) are a set of diagrams illustrating steps in a wiring board manufacturing method according to Embodiment 6B.

DETAILED DESCRIPTION

Figure 1:
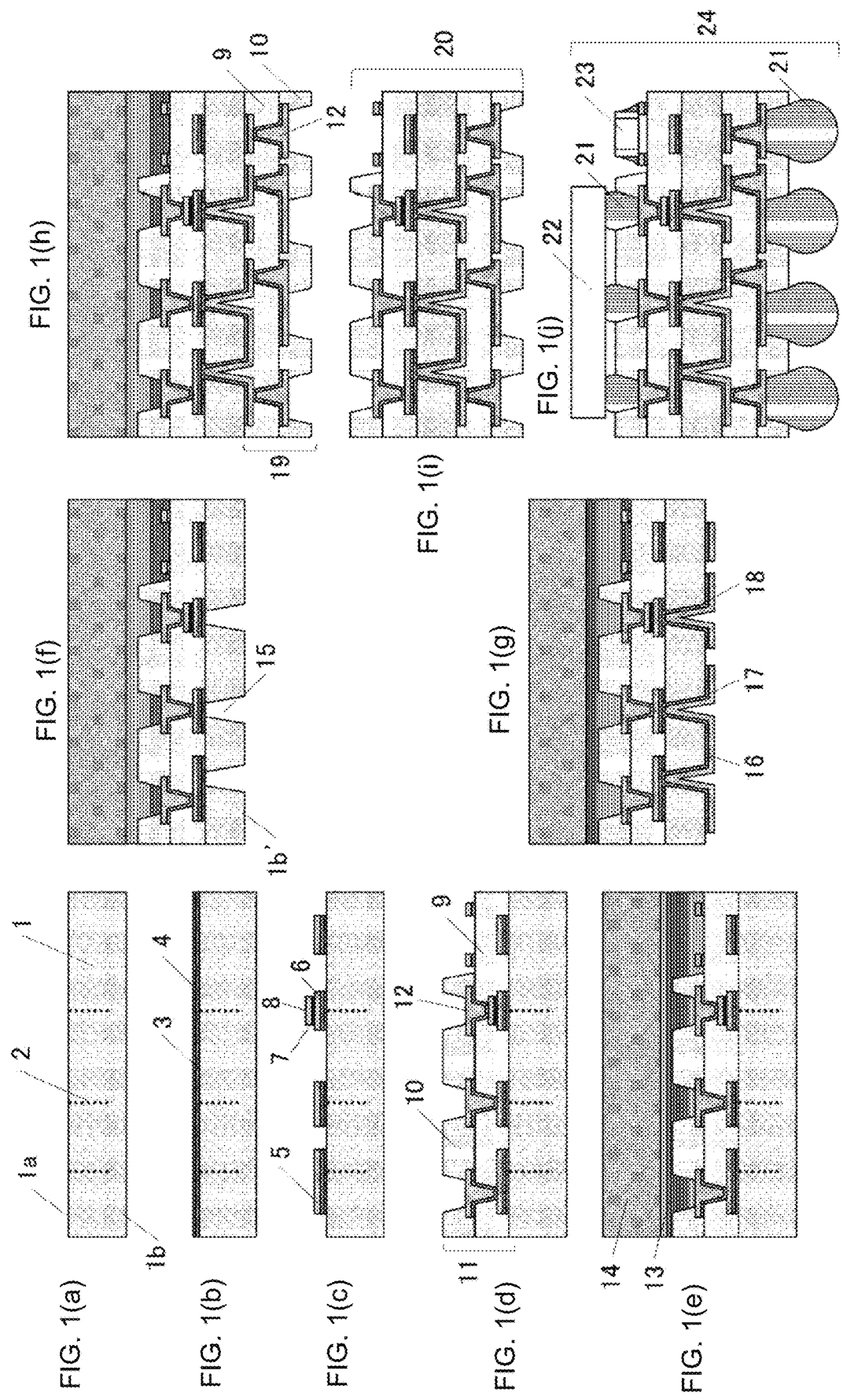
FIGS. 1(a)-1(j) are a set of diagrams illustrating steps in a wiring board manufacturing method according to Embodiment 1A.

Note that in the present disclosure, the term "surface" may refer to not only a surface of a plate-shaped member, but also an interface of a layer included in a plate-shaped member such that the interface is substantially parallel to a surface of the plate-shaped member. The terms "upper surface" and "lower surface" refer to surfaces illustrated in upper and lower areas of a drawing when a plate-shaped member, a layer included in a plate-shaped member, or the like is illustrated in the drawings.

With reference to the drawings, some embodiments of the present invention will be described. Note that the present invention is not limited to these embodiments. In the description of the drawings, the same parts are denoted by the same reference signs.

Embodiment 1A

FIGS. 1(a)-1(j) are a set of diagrams illustrating steps in a wiring board manufacturing method according to Embodiment 1A. Embodiment 1A will be described with reference to FIGS. 1(a)-1(j).

(Step 1)

Alkali-free glass having a thickness of 500 μm is prepared, foreign matter on surfaces of the alkali-free glass is removed by ultrasonic cleaning or the like, and thus a glass substrate 1 is provided. Subsequently, as illustrated in FIG. 1(a), laser light is emitted from a first surface 1a-side area to the glass substrate 1, and a laser-modified portion 2, which is a starting point of a through via, is formed. The laser-modified portion 2 extends from a first surface 1a to a surface 1b, which is vertically opposite, for example, and the amount of laser light is adjusted so that an end of the laser-modified portion 2 is within the glass substrate 1.

Note that the wavelength of a laser to be used here is 535 nm or less, and the laser wavelength is preferably in the range of 355 nm or more and 535 nm or less. Laser output with a laser wavelength less than 355 nm is unlikely to be sufficient, which may make stable laser modification difficult. On the other hand, when the laser wavelength is greater than 535 nm, the irradiation spot becomes larger, making it difficult to form a laser-modified portion having a small area, and the heat causes microcracks instead of modification, making the glass substrate more likely to crack.

Furthermore, when a pulsed laser is used, the laser pulse width is desirably in the range of picoseconds to femtoseconds. When the laser pulse width is greater than or equal to nanoseconds, it is difficult to control the amount of energy per pulse, and microcracks are created, which makes the glass substrate 1 fragile.

The laser pulse energy has a preferable value selected according to the glass material or what laser modification is needed and is preferably set in the range of 5 μJ or more and 150 μJ or less, for example. When the laser pulse energy increases, the laser-modified portion can be made longer in proportion to the increasing laser pulse energy.

Note that in the present embodiment, the step of forming the laser-modified portion by emitting the laser light from one surface to the other surface of the glass substrate is referred to as a step A. The step A corresponds to Step 1 described above, but the disclosure of Step 1 does not limit the step A.

(Step 2)

Next, a hydrofluoric acid resistant metal film 3 having a thickness in the range of nm or more and 500 nm or less is formed on the first surface 1a of the glass substrate 1 by sputtering or the like. Subsequently, a copper film having a thickness in the range of 100 nm or more and 500 nm or less is formed on the hydrofluoric acid resistant metal film 3 by sputtering, electroless plating, or the like, and thus a seed layer 4 is formed on the hydrofluoric acid resistant metal film 3, as illustrated in FIG. 1(b). The material of the hydrofluoric acid resistant metal film 3 is selected, for example, from chromium, nickel, and nickel-chromium, as appropriate.

(Step 3)

Next, a photoresist for a pattern is formed on the first surface 1a of the glass substrate 1. As one example, the first surface 1a-side area is laminated with a dry photoresist (under the product name RD1225) produced by Showa Denko Materials Co., Ltd., the pattern is drawn, then development is performed, and thus the seed layer 4 is exposed. Furthermore, electric power is supplied to the seed layer 4, and electrolytic copper plating is performed to form a copper layer having a thickness of 2 μm or more and 10 μm or less. After the plating, the dry film resist that is no longer needed is dissolved away, the seed layer 4 is etched, and thus a wiring including the hydrofluoric acid resistant metal film 3, the seed layer 4, and the copper layer 5 laminated on each other is formed on the first surface 1a, as illustrated in FIG. 1(c).

Figure 2:
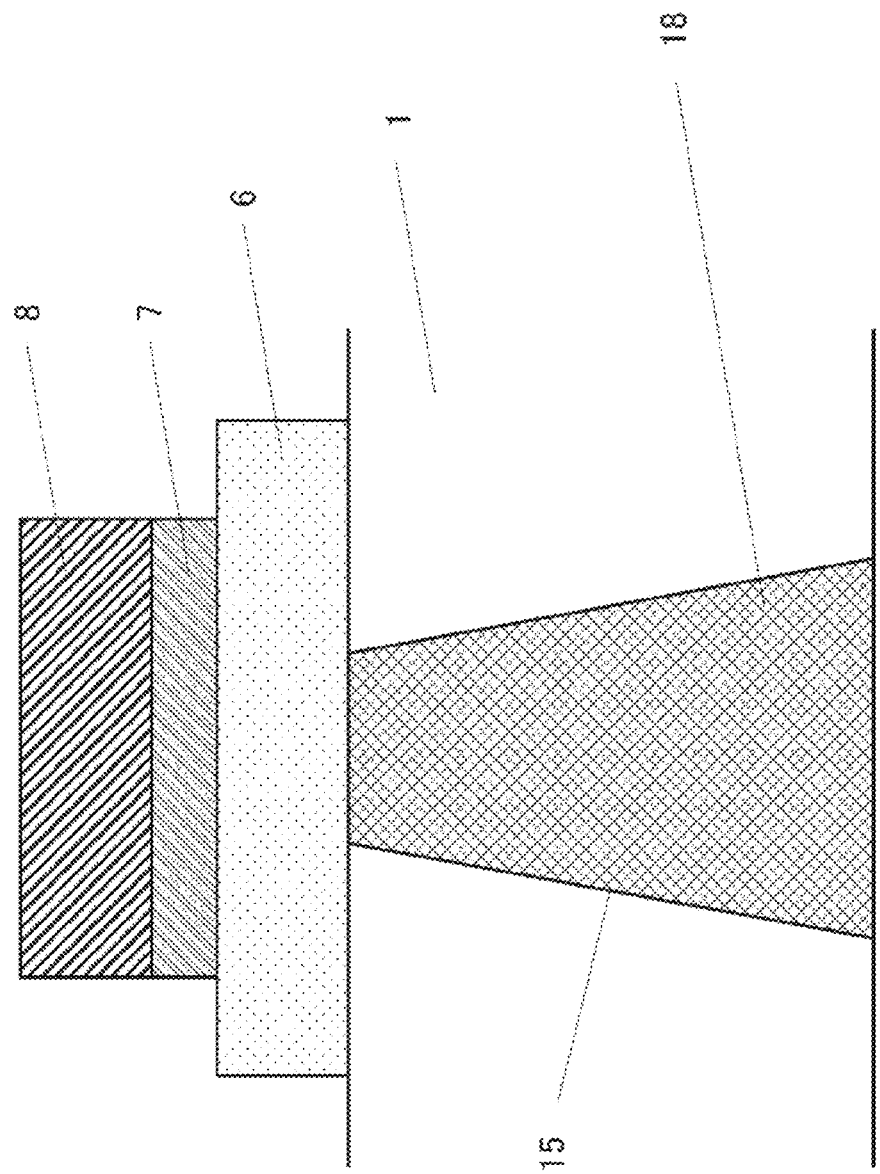
FIG. 2 is a cross-sectional view of a capacitor formed according to the present embodiment.

Here, in addition to the wiring, a capacitor may also be formed on the first surface 1a. The capacitor has a MIM structure in which a dielectric is sandwiched between two conducting plates, as mentioned earlier. An example of the capacitor is shown in FIG. 2, in which a lower electrode 6 is formed directly on the glass substrate 1 or on an insulating resin layer formed on the glass substrate 1, a dielectric 7 is laminated on the lower electrode 6, and furthermore, an upper electrode 8 is laminated on the dielectric 7. Each of the lower electrode 6 and the upper electrode 8 generally has a multilayer structure including: a seed layer that is a thin metal film formed by the above-mentioned electroless nickel plating, sputtering, or the like; and a conductive layer formed on the seed layer from electrolytic copper plating or the like. The capacitance of the capacitor is determined according to the permittivity of the dielectric 7, the area of the upper electrode 8 overlapping with the lower electrode 6, and the distance between the lower electrode 6 and the upper electrode 8. The capacitor can be provided on either side, the first surface 1a or the second surface 1b', of the glass substrate 1.

Furthermore, the lower electrode 6 may be formed at any position, but in the case where a wire is connected from the lower electrode 6 to the second surface 1b' of the glass substrate 1, the lower electrode 6 is preferably formed directly above a through via 15, which will be described in detail later, as illustrated in FIG. 2, in order to reduce the electrical resistance of the wire and shorten the length of the wire.

(Step 4)

Next, as one example, the wire is laminated with an insulating resin 9 (32.5 μm-thick under the product name ABF-GXT31) produced by Ajinomoto Fine-Techno Co., Inc., pre-curing is performed, and then a blind via is formed in the insulating resin 9 using laser machining. Subsequently, a de-smear process is performed so that any smears produced by the laser are removed, a copper film having a thickness in the range of 100 nm or more and 500 nm or less is formed by sputtering and electroless plating, and thus a seed layer is formed. The seed layer is laminated with a dry film resist (under the product name RD1225) produced by Showa Denko Materials Co., Ltd., a pattern is drawn, and then development is performed. Electric power is supplied to the seed layer, and electrolytic copper plating is performed to form a copper layer having a thickness of 2 μm or more and 10 μm or less. After the plating, the dry film resist that is no longer needed is dissolved away, the seed layer is etched, and thus a wiring is formed. After the wiring is formed, a solder resist 10 is formed, patterning is performed using photolithography or the like, and thus a first surface wiring layer 11, which is wiring on the first surface 1a side, is formed, as illustrated in FIG. 1(d). Furthermore, when an external connection terminal 12 or the like is needed, an opening may be provided.

Note that in the present embodiment, the step of forming the first surface wiring layer including the hydrofluoric acid resistant metal film and the copper layer on the first surface of the glass substrate is referred to as a step B. The step B corresponds to Steps 2 to 4 described above, but the disclosure of Steps 2 to 4 does not limit the step B.

(Step 5)

Next, as illustrated in FIG. 1(e), a glass carrier 14 is bonded onto the first surface wiring layer 11 using an adhesive 13 for temporary bonding (for example, under the product name REVALPHA produced by Nitto Denko Corporation). The glass carrier 14 desirably has a thickness in the range of 0.7 mm or more and 10 mm or less in view of transportability thereof after being reduced in thickness. The thickness of the glass carrier 14 may be set, as appropriate, according to the thickness of the glass substrate 1. The glass carrier 14 is illustrated as the support, but the support is not required to be made of glass and may be made of a metal, a resin, or the like.

(Step 6)

Next, using a hydrogen fluoride solution, etching is performed from the surface 1b of the glass substrate 1, which is located on the opposite side from the first surface wiring layer 11. The surface 1b of the glass substrate 1 is etched using the hydrogen fluoride solution, so that the thickness thereof is reduced while the processed glass substrate 1 has a surface opposite which remains parallel with the first surface 1a, as illustrated in FIG. 1(f). When the hydrogen fluoride solution comes into contact with the laser-modified portion 2, the laser-modified portion 2 is dissolved preferentially, and thus the through via 15 is formed. In this manner, the glass substrate 1 is reduced in thickness while the through via 15 is formed therein. In other words, the thickness of the glass substrate 1 is reduced and the through via 15 is formed in one etching process. The lower surface of the glass substrate 1 that has been reduced in thickness is the second surface 1b' on which a second surface wiring layer is to be formed.

Figure 3:
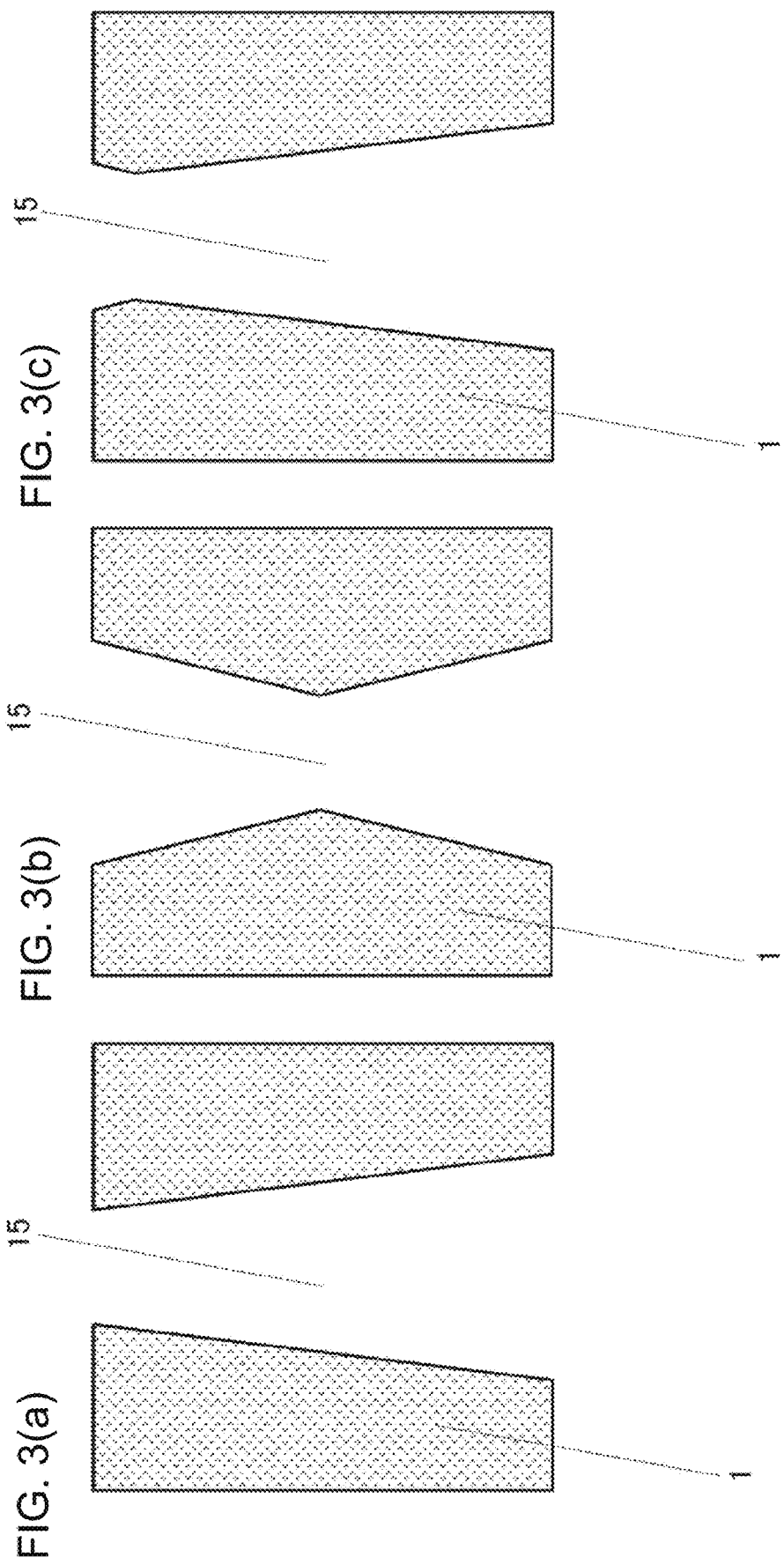
FIGS. 3(a)-3(c) are a set of cross-sectional views of through vias of the wiring board that can be formed according to the present embodiment.

The through via 15 has a frustoconical shape with a diameter (or a cross-sectional area) on the second surface 1b' side greater than a diameter (or a cross-sectional area) on the first surface 1a side. Furthermore, depending on various etching conditions such as the modification position of the laser-modified portion, the concentration of the hydrogen fluoride solution, and the processing temperature, the cross-sectional shape of the through via 15 can be determined from among: (a) the shape of a letter V such that the diameter on the first surface 1a side is less than the diameter on the second surface 1b' side, as mentioned earlier; (b) the shape of a letter X such that a maximum cross-sectional area is provided on one of the first surface 1a side and the second surface 1b' side and a minimum cross-sectional area is provided at a distance of 0.4 T or more and T or less from the first surface 1a where T is the thickness of the glass substrate 1; and (c) the shape of a bottleneck such that a maximum cross-sectional area is provided on one of the first surface 1a side and the second surface 1b' side and a minimum cross-sectional area is provided at a distance of greater than 0 and 0.2 T or less from the first surface 1a where T is the thickness of the glass substrate 1, as illustrated in FIGS. 3(a)-3(c).

The amount to be etched away by the hydrogen fluoride solution may be set, as appropriate, according to the final thickness of the wiring board. For example, when the glass substrate 1 used in Step 1 has a thickness of 400 μm, the amount to be etched away is desirably in the range of 100 μm or more and 350 μm or less.

The glass substrate 1 reduced in thickness preferably has a thickness of 50 μm or more and 300 μm or less. A hydrogen fluoride solution etchant includes, in the hydrogen fluoride solution, one or more inorganic acids selected from the group consisting of nitric acid, hydrochloric acid, and sulfuric acid.

The hydrofluoric acid concentration is desirably, for example, 1.0 wt % or more and 6.0 wt % or less, and preferably 2.0 wt % or more and 5.0 wt % or less. The inorganic acid concentration is in the range of 1.0 wt % or more and 20.0 wt % or less and preferably 3.0 wt % or more and 16.0 wt % or less. It is desirable that with the hydrogen fluoride solution set within the above ranges, the etching rate be set to 1.0 μm/min or less. The temperature of the etchant during etching is desirably 10° C. or more and 40° C. or less.

Note that in the present embodiment, the step of forming the through via 15 in the laser-modified portion 2 and forming the second surface 1b' of the glass substrate 1, which is opposite to the first surface 1a, by etching the surface 1b opposite to the first surface 1a is referred to as a step C. The step C corresponds to Step 6 described above, but the disclosure of Step 6 does not limit the step C.

(Step 7: Through Via Treatment Step)

Furthermore, in the present embodiment, in order to remove etching residues of glass adhered to the hydrofluoric acid resistant metal film 3 (also referred to as glass residues), a surface modification treatment is performed as a through via treatment step. More specifically, the through via 15 is irradiated with plasma (subjected to a plasma treatment) while one or more of CF4 gas, oxygen gas, argon gas, hydrogen gas, and the like are supplied to the through via 15, and thus the etching residues of glass adhered to the hydrofluoric acid resistant metal film 3 are removed, and moreover the wettability of a surface of the hydrofluoric acid resistant metal film 3 is improved.

The method for the surface modification treatment is not particularly specified; any method in which etching residues of glass can be removed, such as a dry method, can be used. Note that selectivity is preferably provided to remove only etching residues of glass while not removing the hydrofluoric acid resistant metal film 3. Since the through via 15 has a frustoconical shape with a diameter (or a cross-sectional area) on the second surface 1b' side greater than a diameter (or a cross-sectional area) on the first surface 1a side, the plasma irradiation efficiency to the hydrofluoric acid resistant metal film 3 is improved, and etching residues of glass are easily removed. In this manner, the etching residues of glass can be removed from the hydrofluoric acid resistant metal film 3; therefore, the reliability of connection of a through via part can be improved, and the transmission characteristics and the electrical characteristics can be improved. Furthermore, the improvement of the wettability of the hydrofluoric acid resistant metal film 3 through the plasma treatment can lead to, for example, reduced plating failures during formation of a conductor layer in a subsequent step.

Subsequently, sputtering or the like is performed on the second surface 1b' with the through via 15 formed thereon, and thus a copper film having a thickness in the range of 100 nm or more and 500 nm or less is formed on the surface of the through via 15 to form a seed layer 16 for power supply. Since the through via 15 has a frustoconical shape, film-forming particles that are scattered linearly are kept from being blocked, which allows the seed layer to be efficiently formed. In this regard, the seed layer may be formed by electroless plating.

Note that in the present embodiment, the step of removing the etching residues of glass adhered to the hydrofluoric acid resistant metal film is referred to as a through via treatment step D. The through via treatment step D corresponds to Step 7 described above, but the disclosure of Step 7 does not limit the through via treatment step D.

(Step 8)

Next, similarly to Step 3 and Step 4, a pattern is formed on the second surface 1b' using a dry film resist, electric power is supplied to the seed layer 16, electrolytic copper plating is performed to form a copper layer 17 having a thickness of 2 μm or more and 10 μm or less, then the dry film resist that is no longer needed is dissolved away, and thus a through electrode 18 is formed, as illustrated in FIG. 1(g). Subsequently, the seed layer 16 is removed at portions that are no longer needed, an outer layer protective film such as the solder resist 10 or the insulating resin 9 is applied as a coating, and thus a second surface wiring layer 19 is formed, as illustrated in FIG. 1(h). Furthermore, when an external connection terminal 12 or the like is needed, an opening may be provided.

Note that in the present embodiment, the step of forming the through electrode in the through via is referred to as a step E. The step E corresponds to Step 8 described above, but the disclosure of Step 8 does not limit the step E.

Figure 4:
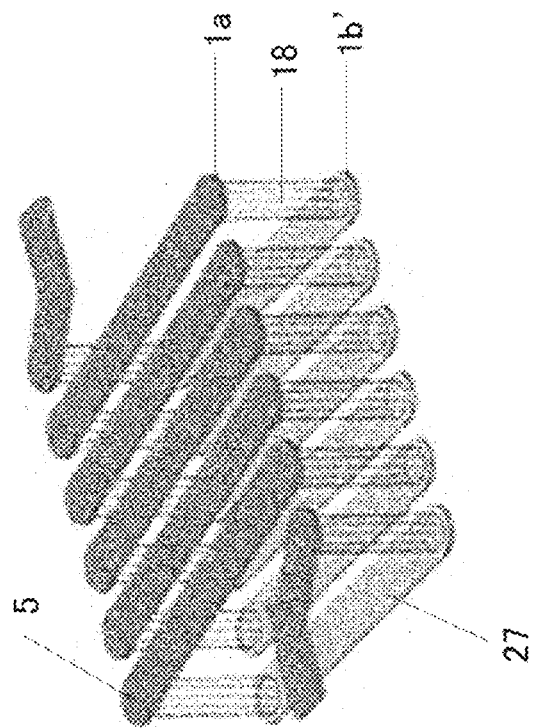
FIG. 4 is a bird's-eye view of an inductor formed according to the present embodiment.

Here, in addition to the wiring, a capacitor and an inductor may also be formed on the second surface 1b'. With the inductor, the glass substrate 1 having the through via 15 can incorporate features that are substantially the same as those of a spiral coil. FIG. 4 provides an illustration in which the flat glass substrate 1 including two rows of the through vias 15 is transparent and a spiral coil is formed using the through vias 15 formed in the glass substrate. Specifically, on the front and back sides (1a, 1b') of the glass substrate 1 not illustrated in the drawing, wirings 27 are formed so as to connect the opening parts of the through vias 15 adjacent to each other in the direction in which the spiral coil is wound. Furthermore, a conductor layer is formed on the inner wall of the through via 15 that connects the front and back sides of the glass substrate 1, and thus the through electrode 18 is formed.

The spiral coil can be fabricated by sequentially connecting the wirings 27, which are formed on the front and back sides (1a, 1b') of the glass substrate 1, in series by the through electrodes 18 in this manner. The properties of the inductor can be adjusted by changing the number of turns, for example. The form of the inductor is not limited to the form described thus far; a coil may be formed in a spiral form by machining the first surface wiring layer 11 and the second surface wiring layer 19 of the glass substrate 1 as with other wirings, or a coil spirally wound around the insulating resin 9 may be formed by providing wirings on each of two conductor layers sandwiching the insulating resin 9, forming the blind vias and the through electrodes in the insulating resin 9, and connecting the wirings on both the conductor layers by the through electrodes.

Figure 5B:
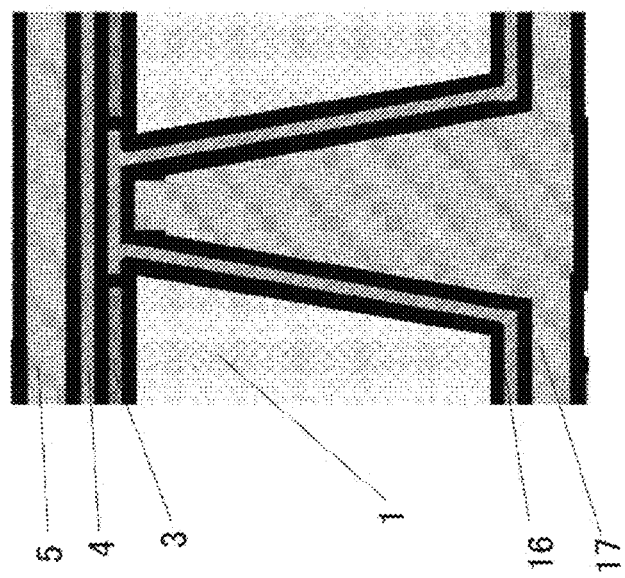
FIG. 5B(a) is a cross-sectional view of one of through electrodes in a filled form that are formed according to the present embodiment and FIG. 5B(b) is a cross-sectional view of a wiring board formed using the through electrodes.
Figure 5B:
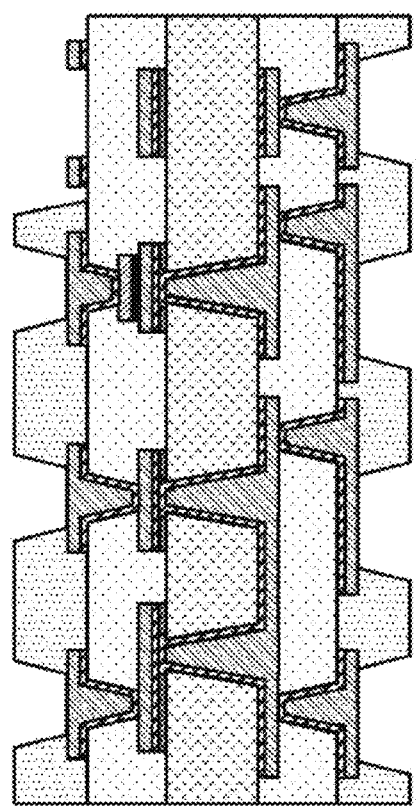

Furthermore, the through electrode 18 can be selectively in a conformal form in which the copper layer 17, which is an electrolytic plating film, is formed along the side wall of the through via 15 and the through via 15 is filled with the insulating resin 9, as illustrated in FIG. 5A(a) and FIG. 5A(b), or in a filled form in which the whole inside of the through via 15 is formed of the copper layer 17, which is an electrolytic plating film, as illustrated in FIG. 5B(a) and FIG. 5B(b) Note that with the filled form illustrated in FIGS. 5B(a) and 5B(b), because the whole inside of the through via 15 is formed of the copper layer 17 having a low electrical resistance, the through electrode 18 has improved electrical characteristics, transmission characteristics, etc., as compared to that with the conformal form illustrated in FIGS. 5A(a) and 5A(b).

With FIG. 3(b) the shape of the letter X and FIG. 3(c) the shape of the bottleneck, a position at which the diameter (the cross-section) is minimum is on the second surface 1b' side away from the first surface 1a, as illustrated in FIGS. 3(a)-3(c), and therefore stress that is generated at the interface between the through electrode 18 and the first surface 1a can be reduced, and the reliability of connection via the through via 15 can be improved, as compared to the case where FIG. 3(a) the shape of the letter V is applied.

The seed layer 16 for power supply on the second surface 1b' is a metal layer made of a material different from the material of the hydrofluoric acid resistant metal film 3 because the subsequent steps do not include an etching process in which the hydrogen fluoride solution is used. Examples of the material different from hydrofluoric acid resistant metals include Ti, Cu, and electroless Ni, and at least one metal layer made from such a material is formed at least on the inner peripheral surface of the through via 15.

The material, the number of layers, and so on are not limited to those indicated above; as illustrated in FIG. 1(h), the material, the number of layers to be laminated, and so on may be set as required. As the first surface wiring layer 11 and the second surface wiring layer 19, at least one layer is laminated; the number of layers to be laminated may be set as required. Furthermore, in the first surface wiring layer 11 and the second surface wiring layer 19, on the insulating resin 9, for example, a spiral coil element in a planar form (for example, in a spiral form) (a solenoid coil formed of the first surface wiring layer, the through electrode, and the second surface wiring layer) or the aforementioned MIM capacitor element (a MIM capacitor including: a lower electrode and a first surface wiring layer formed on the first surface of the glass substrate and including the hydrofluoric acid resistant metal film and the copper layer; a dielectric layer formed on the lower electrode; and an upper electrode formed on the dielectric layer) may also be formed, or an LC filter including the solenoid coil and the MIM capacitor may also be formed. Furthermore, as mentioned above, when the external connection terminal 12 or the like is needed, an opening may be provided.

(Step 9)

Furthermore, as illustrated in FIG. 1(i), the glass carrier 14 temporarily bonded in Step 5 is removed, and thus a wiring board 20 having, on both sides, the first surface wiring layer 11 and the second surface wiring layer 19 electrically connected by the through electrode 18 is completed. Note that two or more wiring layers may be further formed on the front and back of the wiring board 20 by the method in Step 4 after Step 9. After Step 9, because the glass carrier 14 has been removed, the wiring layers can be formed on both sides at the same time, enabling a reduction in steps as compared to the case of per-side formation. Furthermore, in Step 9, because the wiring layers have been formed on the front and back of the glass substrate 1, the wiring board has improved mechanical strength as compared to the glass substrate 1 alone, and occurrences of glass cracking during the transport step for forming a conductive part such as a circuit can be reduced. Moreover, the external connection terminal 12 can also be formed on the wiring board and furthermore, a solder ball 21 can also be formed on the external connection terminal 12.

(Step 10)

As illustrated in FIG. 1(j), a semiconductor chip 22 and a chip component 23 are mounted on one side or both sides of the wiring board 20 using an existing packaging technique, and thus a high-frequency device 24 including the MIM capacitor, the solenoid coil, the LC filter, and the like is completed.

FIG. 6 is a cross-sectional view of the through via and its surroundings in the wiring board formed according to the present embodiment. As illustrated in FIG. 6, on the first surface 1a side of the glass substrate 1, the hydrofluoric acid resistant metal film 3 is formed so as to cover the through via 15, the seed layer 4 is laminated thereon, and the copper layer 5 is formed further thereon. Furthermore, the seed layer 16 for power supply is formed on the inner periphery of the through via 15 of the glass substrate 1, a surface of the hydrofluoric acid resistant metal film 3, and an area on the second surface 1b' side around the through via 15.

According to the present embodiment, the etching residues of glass adhered to the hydrofluoric acid resistant metal film 3 have been removed by the surface modification process, and thus the hydrofluoric acid resistant metal film 3 exposed in the through via 15 and the seed layer 16 are completely in contact, allowing improvements to the transmission characteristics, the electrical characteristics, etc., between the first surface 1a and the second surface 1b' of the wiring board. This allows improvements to the transmission characteristics, the electrical characteristics, etc., of the wiring on the glass substrate 1, the capacitor embedded in the glass substrate 1 and connected to the through via 15, the inductor formed using the through via 15, and the LC filter composed of the capacitor and the inductor.

Furthermore, according to the present embodiment, two or more conductor layers (the seed layer 4) including the hydrofluoric acid resistant metal film 3 are formed between the through electrode 18 and the copper layer 5, and by forming the hydrofluoric acid resistant metal film 3 on the first surface 1a of the glass substrate 1, it is possible to improve the adhesion of the copper layer 5.

Embodiment 2A

Next, Embodiment 2A of the present invention will be described. FIGS. 7(a)-7(k) are a set of diagrams illustrating steps in a wiring board manufacturing method according to Embodiment 2A. Embodiment 2A is different from Embodiment 1A described above only in Step 7 (step D); Steps 1 to 6 and Steps 8, 9 are the same as those described above, and thus overlapping description will be omitted.

(Step 7: Through Via Treatment Step (Dry Etching Process))

In the present embodiment, a dry etching process is performed in order to remove the etching residues of glass attached to the hydrofluoric acid resistant metal film 3 and remove a portion of the hydrofluoric acid resistant metal film 3. The method for dry etching is not particularly specified; any method in which the hydrofluoric acid resistant metal film 3 can be removed, such as a dry method, can be used. For example, reactive ion etching, sputter etching, or the like is preferably used. The through via 15 has a frustoconical shape with a diameter (or a cross-sectional area) on the second surface 1b' side greater than a diameter (or a cross-sectional area) on the first surface 1a side, and therefore ions, sputtered particles, or the like easily reach the hydrofluoric acid resistant metal film 3. In this manner, the etching residues of glass and a portion of the metal film having a high resistivity can be removed simultaneously; therefore, the reliability of connection of the through via part can be improved, and the transmission characteristics and the electrical characteristics can be improved.

The hydrofluoric acid resistant metal film 3 on the through via 15 is thinner than the hydrofluoric acid resistant metal film 3 in areas other than the through via 15, and the hydrofluoric acid resistant metal film 3 on the through via 15 is etched vertically (substantially vertically) from a through via end portion. In other words, the inner periphery of a bottomed opening 3a (FIG. 8) formed in the hydrofluoric acid resistant metal film 3 is vertical with respect to the first surface 1a.

Subsequently, sputtering or the like is performed on the second surface 1b' with the through via 15 formed thereon, and thus a copper film having a thickness in the range of 100 nm or more and 500 nm or less is formed on the inside of the bottomed opening 3a and the inner surface of the through via 15 to form the seed layer 16 for power supply. Using dry etching, the hydrofluoric acid resistant metal film 3 is etched from the end portion of the through via 15 perpendicularly to the first surface 1a. This configuration and the frustoconical shape of the through via 15 together suppress film-forming particles that are scattered linearly from being blocked during formation of the seed layer 16 by sputtering, the throwing power of a film-forming material at the bottom of the through via 15 is improved, void formation in the through via 15 part is reduced, and the reliability of connection of the through electrode 18 is improved. In this regard, the seed layer 16 may be formed by electroless plating.

Note that in the present embodiment, the step of removing a portion of the hydrofluoric acid resistant metal film 3 is referred to as a through via treatment step D. The through via treatment step D corresponds to Step 7 described above, but the disclosure of Step 7 does not limit the through via treatment step D.

With the hydrofluoric acid resistant metal film 3 that has been treated to have a thickness of at most 50% of the thickness of the hydrofluoric acid resistant metal film 3 that has not yet been treated, degradation of the electrical characteristics via the through via 15 can be reduced. However, when the thickness of the hydrofluoric acid resistant metal film 3 exceeds 50%, the removal may not be sufficient depending on the etching residues, which may cause the failure to provide adhesion to a metal or the failure to obtain good electrical characteristics, for example.

Furthermore, according to the present embodiment, two or more conductor layers (the seed layer 4) including the hydrofluoric acid resistant metal film 3 are formed between the through electrode 18 and the copper layer 5, and by forming the hydrofluoric acid resistant metal film 3 on the first surface 1a of the glass substrate 1, it is possible to improve the adhesion of the copper layer 5.

FIG. 8 is a cross-sectional view of the through via and its surroundings in the wiring board formed according to the present embodiment.

FIG. 9 is a cross-sectional view of a through via and its surroundings in a wiring board according to a comparative example. Steps in the manufacture according to the comparative example illustrated in FIG. 9 are the same as the steps according to the present embodiment, except that Step 7 is not performed.

As illustrated in FIG. 8, on the first surface 1a side of the glass substrate 1, the hydrofluoric acid resistant metal film 3 is formed so as to cover the through via 15, the seed layer 4 is laminated thereon, and the copper layer 5 is formed further thereon. Furthermore, the seed layer 16 for power supply is formed on the inner periphery of the through via 15 of the glass substrate 1, a surface of the hydrofluoric acid resistant metal film 3, and an area on the second surface side around the through via 15.

According to the present embodiment, a portion of the hydrofluoric acid resistant metal film 3 located above the inside of the upper edge of the through via 15 is thinner than a portion of the hydrofluoric acid resistant metal film 3 located above the outside of the upper edge of the through via 15 as a result of the dry etching process step. Because of the anisotropy of dry etching, the hydrofluoric acid resistant metal film 3 is etched substantially perpendicularly to the first surface 1a.

In the comparative example illustrated in FIG. 9, the dry etching process step is not performed, and therefore glass etching residues GER are left on the lower surface of the hydrofluoric acid resistant metal film 3 on the inner periphery side of the upper edge of the through via 15. In the comparative example, the transmission characteristics, the electrical characteristics, etc., of the through electrode 18 deteriorate due to the etching residues GER remaining between the hydrofluoric acid resistant metal film 3 and the seed layer 16. This leads to deterioration of the transmission characteristics, the electrical characteristics, etc., of the wiring on the glass substrate 1, the capacitor embedded in the glass substrate 1 and connected to the through via 15, the inductor formed using the through via 15, and the LC filter composed of the capacitor and the inductor.

In this regard, according to the present embodiment, as a result of the dry etching process step, the surface of the hydrofluoric acid resistant metal film 3 has been etched, and therefore the glass etching residues GER such as those according to the comparative example can be completely removed, allowing improvements to the transmission characteristics, the electrical characteristics, etc., between the first surface 1a and the second surface 1b' of the wiring board. This allows improvements to the transmission characteristics, the electrical characteristics, etc., of the wiring on the glass substrate 1, the capacitor embedded in the glass substrate 1 and connected to the through via 15, the inductor formed using the through via 15, and the LC filter composed of the capacitor and the inductor.

Furthermore, in the comparative example illustrated in FIG. 9, the hydrofluoric acid resistant metal film 3 having an electrical resistance higher than the electrical resistance of copper or the like remains thick. In contrast, in the present embodiment, a portion of the hydrofluoric acid resistant metal film 3 is removed for reduction in thickness, and therefore the transmission characteristics, the electrical characteristics, etc., between the first surface 1a and the second surface 1b' of the wiring board can be improved. This allows improvements to the transmission characteristics, the electrical characteristics, etc., of the wiring on the glass substrate 1, the capacitor embedded in the glass substrate 1 and connected to the through via 15, the inductor formed using the through via 15, and the LC filter composed of the capacitor and the inductor.

Embodiment 1B

Next, Embodiment 1B of the present invention will be described. Embodiment 1B is different from Embodiment 1A described above only in Step 7 (Step D); Steps 1 to 6 and Steps 8, 9 are the same as those described above, and thus overlapping description will be omitted.

(Step 7: Through Via Treatment Step (Wet Etching Process))

Furthermore, in the present embodiment, a portion of the hydrofluoric acid resistant metal film 3 region exposed from the through via 15 formed using the hydrogen fluoride solution is removed by a wet etching process that is a through via treatment step. The method for the removal is not specified; any wet method in which the hydrofluoric acid resistant metal film 3 can be removed using a corrosive solution can be used, and a chromium etchant, for example, is preferably used.

Specifically, as a result of diligent research, from the perspective of etching selectivity of the hydrofluoric acid resistant metal film 3 to be etched and the glass, the copper, the insulating resin, etc., that are different from the hydrofluoric acid resistant metal film 3 and do not need to be etched, the treatment is performed at a temperature of 40° C. for 1.5 minutes using an alkaline chromium etchant produced by Nihon Kagaku Sangyo Co., Ltd. and containing potassium ferricyanide and potassium hydroxide. This allows only the hydrofluoric acid resistant metal film 3 to be etched without causing damage to the glass substrate 1, the insulating resin 9, etc., other than the hydrofluoric acid resistant metal film 3.

Since the through via 15 has a frustoconical shape with a diameter (or a cross-sectional area) on the second surface 1b' side greater than a diameter (or a cross-sectional area) on the first surface 1a side, circulation of the etchant in the through via 15 is promoted, allowing the process to be efficiently performed. Furthermore, it is preferable that before the etching, ultrasonic cleaning or a plasma treatment in which one or more of CF4 gas, oxygen gas, argon gas, hydrogen gas, and the like are used be performed on a target portion as a pretreatment to improve the wettability; performing both the plasma treatment and the ultrasonic cleaning, which further increases wettability improvement effects, is more preferable. In this manner, the etching residues of glass (also referred to as glass residues) and a portion of the metal film having a high resistivity can be removed simultaneously; therefore, the reliability of connection of the through via part can be improved, and the transmission characteristics and the electrical characteristics can be improved.

Subsequently, a copper film having a thickness in the range of 100 nm or more and 500 nm or less is formed by electroless plating or the like on the second surface 1b' with the through via 15 formed thereon, to form the seed layer 16 for power supply. The electroless plating is applied with the aim of improving the adhesion of the layer material to the undercut in this example, but the seed layer may be formed by sputtering depending on the shape.

With the hydrofluoric acid resistant metal film 3 that has been treated to have a thickness of at most 50% of the thickness of the hydrofluoric acid resistant metal film 3 that has not yet been treated, degradation of the electrical characteristics via the through via 15 can be reduced. However, when the thickness of the hydrofluoric acid resistant metal film 3 exceeds 50%, the removal may not be sufficient depending on the etching residues, which may cause the failure to provide adhesion to a metal or the failure to obtain good electrical characteristics, for example.

Note that in the present embodiment, the step of removing a portion of the hydrofluoric acid resistant metal film 3 is referred to as a through via treatment step D. The through via treatment step D corresponds to Step 7 described above, but the disclosure of Step 7 does not limit the through via treatment step D.

Figure 10:
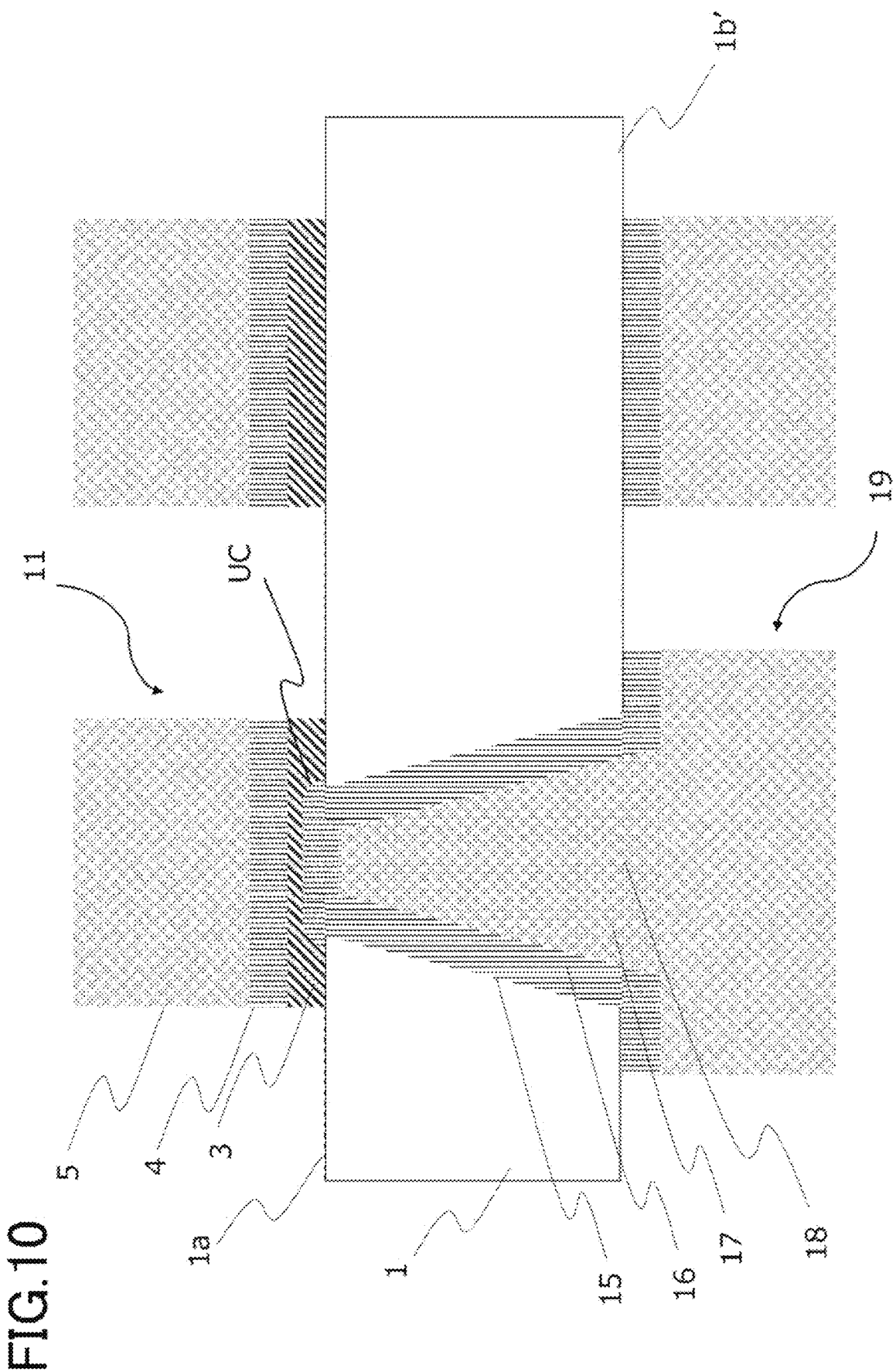
FIG. 10 is a cross-sectional view of a through via and its surroundings in a wiring board formed according to Embodiment 1B.

FIG. 10 is a cross-sectional view of the through via and its surroundings in the wiring board formed according to the present embodiment.

The steps in the manufacture according to the comparative example illustrated in FIG. 9 are the same as the steps according to the present embodiment, except that the etching process in Step 7 is not performed.

As illustrated in FIG. 10, on the first surface 1a side of the glass substrate 1, the hydrofluoric acid resistant metal film 3 is formed so as to cover the through via 15, the seed layer 4 is laminated thereon, and the copper layer 5 is formed further thereon. Furthermore, the seed layer 16 for power supply is formed on the inner periphery of the through via 15 of the glass substrate 1, a surface of the hydrofluoric acid resistant metal film 3, and an area on the second surface 1b' side around the through via 15.

According to the present embodiment, a portion of the hydrofluoric acid resistant metal film 3 located above the inside of the upper edge of the through via 15 is thinner than a portion of the hydrofluoric acid resistant metal film 3 located above the outside of the upper edge of the through via 15 as a result of the wet etching process step. Furthermore, by the selectivity of the wet etching, the etching of the through via 15 is minimized even when the hydrofluoric acid resistant metal film 3 is etched, and therefore the hydrofluoric acid resistant metal film 3 is etched towards the side (radially outward) relative to the upper edge of the through via 15. A recess thus formed in the hydrofluoric acid resistant metal film 3 is referred to as an undercut UC.

In the comparative example illustrated in FIG. 9, the lower flat surface of the hydrofluoric acid resistant metal film 3 covers the upper end of the through via 15, and there is no undercut generated. Furthermore, since the dry etching process step is not performed, the glass etching residues GER are left on the lower surface of the hydrofluoric acid resistant metal film 3 on the inner periphery side of the upper edge of the through via 15. In the comparative example, the transmission characteristics, the electrical characteristics, etc., of the through electrode 18 deteriorate due to the etching residues GER remaining between the hydrofluoric acid resistant metal film 3 and the seed layer 16. This leads to deterioration of the transmission characteristics, the electrical characteristics, etc., of the wiring on the glass substrate 1, the capacitor embedded in the glass substrate 1 and connected to the through via 15, the inductor formed using the through via 15, and the LC filter composed of the capacitor and the inductor.

In this regard, according to the present embodiment, as a result of the wet etching process, the surface of the hydrofluoric acid resistant metal film 3 has been etched, and therefore the glass etching residues GER such as those according to the comparative example can be completely removed, allowing improvements to the transmission characteristics, the electrical characteristics, etc., between the first surface 1a and the second surface 1b' of the wiring board. This allows improvements to the transmission characteristics, the electrical characteristics, etc., of the wiring on the glass substrate 1, the capacitor embedded in the glass substrate 1 and connected to the through via 15, the inductor formed using the through via 15, and the LC filter composed of the capacitor and the inductor.

Furthermore, in the comparative example illustrated in FIG. 9, the hydrofluoric acid resistant metal film 3 does not include an undercut, and therefore the electrical connection between the hydrofluoric acid resistant metal film 3 and the seed layer 16 is limited to the range inside the upper edge of the through via 15, and the hydrofluoric acid resistant metal film 3 having a higher electrical resistance than copper or the like remains thick. In contrast, in the present embodiment, the hydrofluoric acid resistant metal film 3 is etched in the shape of a dome from the upper edge of the through via 15 so as to include the undercut UC, and therefore the area of contact between the hydrofluoric acid resistant metal film 3 and the seed layer 16 can be increased and in addition, since a portion of the hydrofluoric acid resistant metal film 3 is removed for reduction in thickness, the transmission characteristics, the electrical characteristics, etc., between the first surface 1a and the second surface 1b' of the wiring board can be improved. This allows improvements to the transmission characteristics, the electrical characteristics, etc., of the wiring on the glass substrate 1, the capacitor embedded in the glass substrate and connected to the through via, the inductor formed using the through via, and the LC filter composed of the capacitor and the inductor.

Furthermore, in the comparative example illustrated in FIG. 9, since the hydrofluoric acid resistant metal film 3 does not include an undercut, the bonding between the hydrofluoric acid resistant metal film 3 and the seed layer 16 is limited to the range inside the upper edge of the through via 15. In contrast, in the present embodiment, since the hydrofluoric acid resistant metal film 3 includes the undercut UC, an upper end portion of the seed layer 16 extends to the outside of the upper edge of the through via 15 and comes into close contact with the undercut UC. In other words, the maximum outer diameter of the upper end of the seed layer 16 is greater than the largest inner diameter of the upper end of the through via 15, and therefore even when a force is applied to separate the seed layer 16 from the glass substrate 1, the seed layer 16 can withstand this force.

Embodiment 3A

Next, FIGS. 11(a)-11(k) are a set of diagrams illustrating steps in a wiring board manufacturing method according to Embodiment 3A. Embodiment 3A of the present invention will be described with reference to FIGS. 11(a)-11(k). Embodiment 3A is different from Embodiment 1A described above only in Step 1 and Step 6; Steps 2 to 5 and Steps 7 to 10 are the same as those described above, and thus overlapping description will be omitted.
(Step 1)

Figure 11:
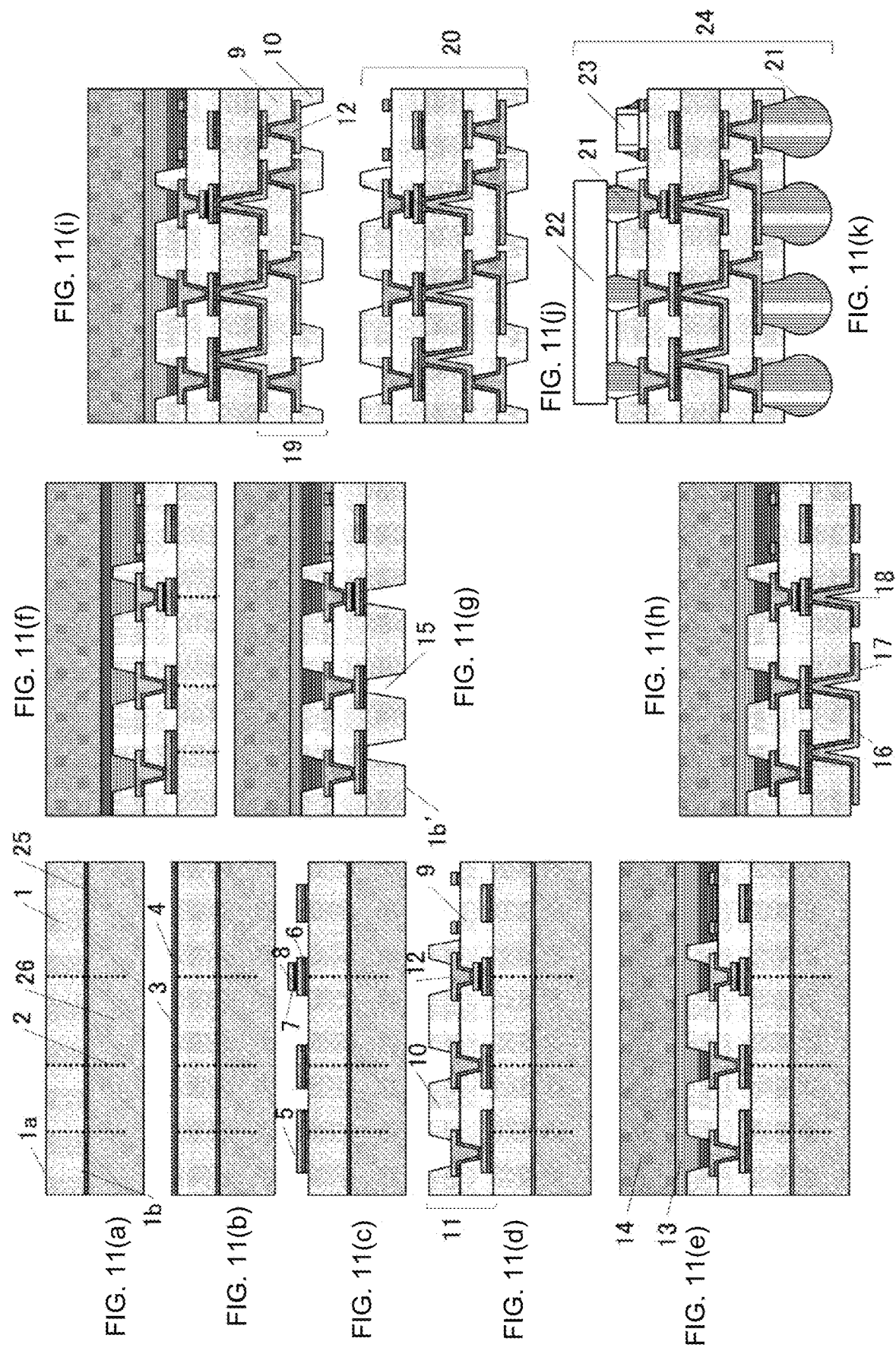
FIGS. 11(a)-11(k) are a set of diagrams illustrating steps in a wiring board manufacturing method according to Embodiment 3A.

Alkali-free glass having a thickness of 130 μm is prepared, foreign matter on surfaces of the alkali-free glass is removed by ultrasonic cleaning or the like, and thus a glass substrate 1 is provided. Subsequently, as illustrated in FIG. 11(a), a glass substrate securing glass carrier 26 is bonded onto the surface 1b opposite to the first surface using an adhesive 25 for temporary bonding. The glass substrate securing glass carrier 26 desirably has a thickness in the range of 0.7 mm or more and 10 mm or less in view of the transportability thereof during machining. The thickness of the glass substrate securing glass carrier 26 may be set, as appropriate, according to the thickness of the glass substrate 1. The glass substrate securing glass carrier 26 is illustrated as the support, but the support is not required to be made of glass and may be made of a metal, a resin, or the like.

Next, laser light is emitted from the first surface 1a-side area to the glass substrate 1, and the laser-modified portion 2, which is a starting point of a through via, is formed. The amount of laser light is adjusted so that the laser-modified portion 2 extends from the first surface 1a to the surface 1b, which is vertically opposite, for example, and that an end of the laser-modified portion 2 passes through the glass substrate 1 and is within the glass substrate securing glass carrier 26.
(Step 6)

As illustrated in FIG. 11(f), the glass substrate securing glass carrier 26 that has been temporarily bonded in Step 1 is removed, and the glass substrate 1 is exposed. Next, using a hydrogen fluoride solution, etching is performed from the surface 1b of the glass substrate 1, which is located on the opposite side from the first surface wiring layer 11. The surface 1b of the glass substrate 1 is etched using the hydrogen fluoride solution, so that the thickness thereof is reduced while the processed glass substrate 1 has a surface opposite which remains parallel with the first surface 1a, as illustrated in FIG. 11(g). When the hydrogen fluoride solution comes into contact with the laser-modified portion 2, the laser-modified portion 2 is dissolved preferentially, and thus the through via 15 is formed. In this manner, the glass substrate 1 is reduced in thickness while the through via 15 is formed therein. In other words, the thickness of the glass substrate 1 is reduced and the through via 15 is formed in one etching process. The lower surface of the glass substrate 1 that has been reduced in thickness is the second surface 1b' on which a second surface wiring layer is to be formed.

The through via 15 has a frustoconical shape with a diameter (or a cross-sectional area) on the second surface 1b' side greater than a diameter (or a cross-sectional area) on the first surface 1a side. Furthermore, depending on various etching conditions such as the modification position of the laser-modified portion, the concentration of the hydrogen fluoride solution, and the processing temperature, the cross-sectional shape of the through via 15 can be determined from among: (a) the shape of a letter V such that the diameter on the first surface 1a side is less than the diameter on the second surface 1b' side, as mentioned earlier; (b) the shape of a letter X such that a maximum cross-sectional area is provided on one of the first surface 1a side and the second surface 1b' side and a minimum cross-sectional area is provided at a distance of 0.4 T or more and 0.6 T or less from the first surface 1a where T is the thickness of the glass substrate 1; and (c) the shape of a bottleneck such that a maximum cross-sectional area is provided on one of the first surface 1a side and the second surface 1b' side and a minimum cross-sectional area is provided at a distance of greater than 0 and 0.2 T or less from the first surface 1a where T is the thickness of the glass substrate 1, as illustrated in FIGS. 3(a)-3(c).

When the glass substrate 1 is formed on the glass substrate securing glass carrier 26, laser-modified portions are formed, and before the etching in which the hydrogen fluoride solution is used, the glass substrate securing glass carrier 26 is removed, the laser-modified portions 2 of the glass substrate 1 are formed for the entire depth, meaning that there is less variation in depth among the modified portions as compared to Embodiment 1A. Therefore, there is less variation in diameter among through vias that are formed after the etching in which the hydrogen fluoride solution is used, leading to improved machining accuracy.

Embodiment 2B

Next, FIGS. 12(a)-12(l) are a set of diagrams illustrating steps in a wiring board manufacturing method according to Embodiment 2B. Embodiment 2B of the present invention will be described with reference to FIGS. 12(a)-12(l). Embodiment 2B is different from Embodiment 1B described above only in Step 1 and Step 6; Steps 2 to 5 and Steps 7 to 10 are the same as those described above, and thus overlapping description will be omitted.
(Step 1)

Figure 12:
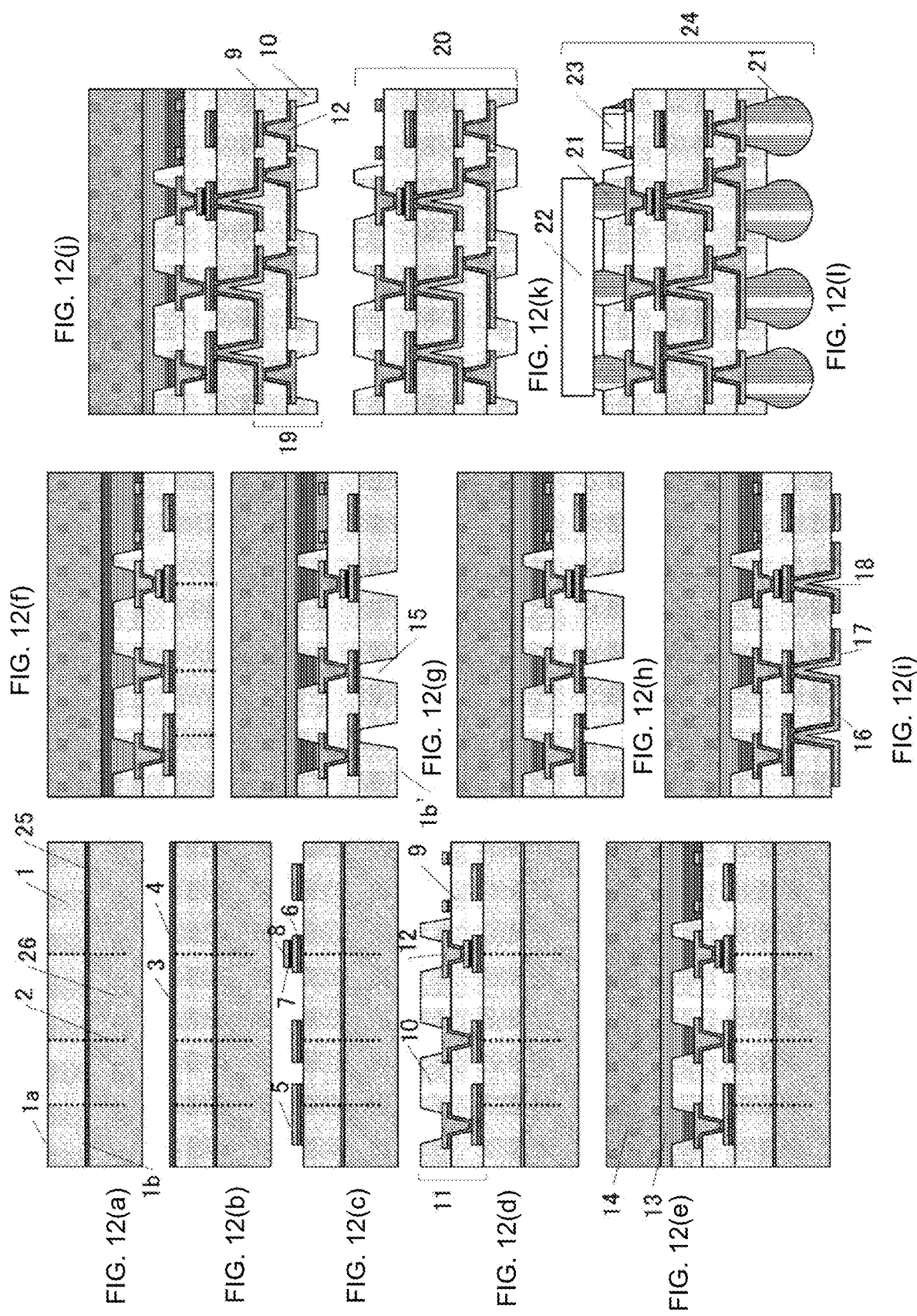
FIGS. 12(a)-12(l) are a set of diagrams illustrating steps in a wiring board manufacturing method according to Embodiment 2B.

Alkali-free glass having a thickness of 130 μm is prepared, foreign matter on surfaces of the alkali-free glass is removed by ultrasonic cleaning or the like, and thus a glass substrate 1 is provided. Subsequently, as illustrated in FIG. 12(a), the glass substrate securing glass carrier 26 is bonded onto the surface 1b opposite to the first surface using the adhesive 25 for temporary bonding. The glass substrate securing glass carrier 26 desirably has a thickness in the range of 0.7 mm or more and 10 mm or less in view of the transportability thereof during machining. The thickness of the glass substrate securing glass carrier 26 may be set, as appropriate, according to the thickness of the glass substrate 1. The glass substrate securing glass carrier 26 is illustrated as the support, but the support is not required to be made of glass and may be made of a metal, a resin, or the like.

Next, as illustrated in FIG. 28(b), laser light is emitted from the first surface 1a-side area to the glass substrate 1, and the laser-modified portion 2, which is a starting point of a through via, is formed. The amount of laser light is adjusted so that the laser-modified portion 2 extends from the first surface 1a to the surface 1b, which is vertically opposite, for example, and that an end of the laser-modified portion 2 passes through the glass substrate 1 and is within the glass substrate securing glass carrier 26.

(Step 6)

As illustrated in FIG. 12(f), the glass substrate securing glass carrier 26 that has been temporarily bonded in Step 1 is removed, and the glass substrate 1 is exposed. Next, using a hydrogen fluoride solution, etching is performed from the surface 1b of the glass substrate 1, which is located on the opposite side from the first surface wiring layer 11. The surface 1b of the glass substrate 1 is etched using the hydrogen fluoride solution, so that the thickness thereof is reduced while the processed glass substrate 1 has a surface opposite which remains parallel with the first surface 1a of the glass substrate 1, as illustrated in FIG. 12(g). When the hydrogen fluoride solution comes into contact with the laser-modified portion 2, the laser-modified portion 2 is dissolved preferentially, and thus the through via 15 is formed. In this manner, the glass substrate 1 is reduced in thickness while the through via 15 is formed therein. In other words, the thickness of the glass substrate 1 is reduced and the through via 15 is formed in one etching process. The lower surface of the glass substrate 1 that has been reduced in thickness is the second surface 1b' on which a second surface wiring layer is to be formed.

The through via 15 has a frustoconical shape with a diameter (or a cross-sectional area) on the second surface 1b' side greater than a diameter (or a cross-sectional area) on the first surface 1a side. Furthermore, depending on various etching conditions such as the modification position of the laser-modified portion, the concentration of the hydrogen fluoride solution, and the processing temperature, the cross-sectional shape of the through via 15 can be determined from among: (a) the shape of a letter V such that the diameter on the first surface 1a side is less than the diameter on the second surface 1b' side, as mentioned earlier; (b) the shape of a letter X such that a maximum cross-sectional area is provided on one of the first surface 1a side and the second surface 1b' side and a minimum cross-sectional area is provided at a distance of 0.4 T or more and T or less from the first surface 1a where T is the thickness of the glass substrate 1; and (c) the shape of a bottleneck such that a maximum cross-sectional area is provided on one of the first surface 1a side and the second surface 1b' side and a minimum cross-sectional area is provided at a distance of greater than 0 and 0.2 T or less from the first surface 1a where T is the thickness of the glass substrate 1, as illustrated in FIGS. 3(a)-3(c).

When the glass substrate 1 is formed on the glass substrate securing glass carrier 26, laser-modified portions are formed, and before the etching in which the hydrogen fluoride solution is used, the glass substrate securing glass carrier 26 is removed, the laser-modified portions 2 of the glass substrate 1 are formed for the entire depth, meaning that there is less variation in depth among the modified portions as compared to Embodiment 1B. Therefore, there is less variation in diameter among through vias that are formed after the etching in which the hydrogen fluoride solution is used, leading to improved machining accuracy.

Embodiment 4A

Next, Embodiment 4A of the present invention will be described. Embodiment 4A is different from Embodiment 1A and Embodiment 2A described above only in Step 7 (step D); Steps 1 to 6 and Steps 8 to 10 are the same as those described above, and thus overlapping description will be omitted.

(Step 7: Through Via Treatment Step (Dry Etching Process))

In the present embodiment, dry etching is performed in order to remove the etching residues of glass attached to the hydrofluoric acid resistant metal film 3 and remove the hydrofluoric acid resistant metal film 3 until a through-hole is formed. The method for dry etching is not particularly specified; any method in which the hydrofluoric acid resistant metal film 3 can be removed, such as a dry method, can be used. For example, reactive ion etching, sputter etching, or the like is preferably used. In this manner, the etching residues of glass and a portion of the metal film having a high resistivity can be removed simultaneously; therefore, the reliability of connection of the through via part can be improved, and the transmission characteristics and the electrical characteristics can be improved.

Subsequently, sputtering or the like is performed on the second surface 1b' with the through via 15 formed thereon, and thus a copper film having a thickness in the range of 100 nm or more and 500 nm or less is formed on the inner peripheral surface of a through opening 3b and the inner surface of the through via 15 to form the seed layer 16 for power supply. Using dry etching, the hydrofluoric acid resistant metal film 3 is etched from the through via end portion perpendicularly to the first surface 1a. This configuration and the frustoconical shape of the through via 15 together suppress film-forming particles that are scattered linearly from being blocked during formation of the seed layer by sputtering, the throwing power of a film-forming material at the bottom of the through via 15 is improved, void formation in the through via 15 part is reduced, and the reliability of connection of the through electrode 18 is improved. In this regard, the seed layer 16 may be formed by electroless plating.

In the present embodiment, the length of time for etching the hydrofluoric acid resistant metal film 3 is longer than that in Embodiment 2A. Therefore, an opening extending through the hydrofluoric acid resistant metal film 3 exposed from the through via 15 is formed, and the seed layer 4 located on the back side is exposed. Thus, the seed layer 16 for power supply is formed on the inner periphery of the through via 15 and is formed inside the opening extending through the hydrofluoric acid resistant metal film 3 and on a surface of the seed layer 4.

Figure 13:
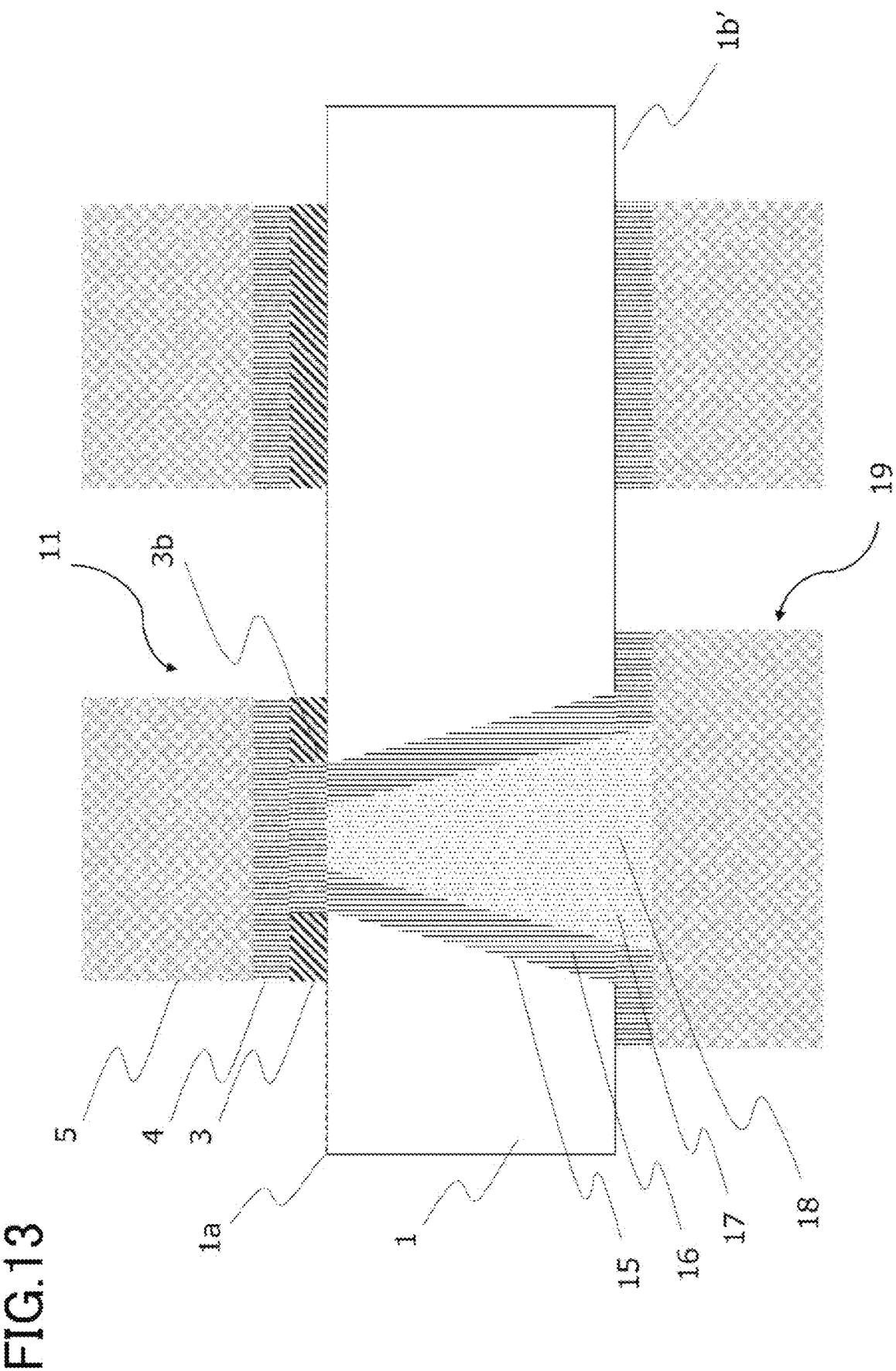
FIG. 13 is a cross-sectional view of a through via and its surroundings in a wiring board formed according to Embodiment 4A.

FIG. 13 is a cross-sectional view of the through via and its surroundings in the wiring board formed according to the present embodiment. With the dry etching process step according to the present embodiment, the etching residues of glass and a portion of the hydrofluoric acid resistant metal film 3 having a high resistivity can be removed simultaneously; therefore, the reliability of connection of the through electrode 18 can be improved, and the transmission characteristics and the electrical characteristics can be improved. This allows improvements to the transmission characteristics, the electrical characteristics, etc., of the wiring on the glass substrate 1, the capacitor embedded in the glass substrate and connected to the through via, the inductor formed using the through via, and the LC filter composed of the capacitor and the inductor.

In other words, the seed layer 4 on the first surface 1a side of the glass substrate 1 and the seed layer 16 for power supply that extends from the second surface 1b' side through the through via 15 are, for example, made of the same material and directly connected without the hydrofluoric acid resistant metal film 3 interposed therebetween, leading to further improvements to the transmission characteristics and the electrical characteristics of the through electrode 18. This allows improvements to the transmission characteristics, the electrical characteristics, etc., of the wiring on the glass substrate 1, the capacitor embedded in the glass substrate and connected to the through via, the inductor formed using the through via, and the LC filter composed of the capacitor and the inductor. Furthermore, since the hydrofluoric acid resistant metal film 3 is removed, it is no longer necessary to additionally perform processes for ensuring the adhesion to the hydrofluoric acid resistant metal film 3, such as the process of forming the adhesive layer, and an increase in the number of processes can be reduced.

Furthermore, as a result of the dry etching process step according to the present embodiment, the hydrofluoric acid resistant metal film 3 on the through via 15 part includes the through opening 3b etched from the upper end of the through via 15 perpendicularly to the first surface 1a. This improves the throwing power of a film-forming material at the bottom of the through via when the seed layer is formed by sputtering, resulting in reduced void formation in the through via part and improvements to the reliability of connection of the through electrode 18.

Embodiment 3B

Next, Embodiment 3B of the present invention will be described. Embodiment 3B is different from Embodiment 1B described above only in Step 7 (step D); Steps 1 to 6 and Steps 8 to 10 are the same as those described above, and thus overlapping description will be omitted.

(Step 7: Through Via Treatment Step (Wet Etching Process))

A portion of the hydrofluoric acid resistant metal film region exposed from the through via formed using the hydrogen fluoride solution is removed by a wet etching process that is a through via treatment step. The method for the removal is not specified; any wet method in which the hydrofluoric acid resistant metal film can be removed using a corrosive solution can be used, and a chromium etchant, for example, is preferably used. Specifically, as a result of diligent research, from the perspective of etching selectivity of the hydrofluoric acid resistant metal film 3 to be etched and the glass, the copper, the insulating resin, etc., that are different from the hydrofluoric acid resistant metal film 3 and do not need to be etched, the treatment is performed at a temperature of 40° C. for 1.5 minutes using an alkaline chromium etchant produced by Nihon Kagaku Sangyo Co., Ltd. and containing potassium ferricyanide and potassium hydroxide. This allows only the hydrofluoric acid resistant metal film 3 to be etched without causing damage to the glass substrate 1, the insulating resin 9, etc., other than the hydrofluoric acid resistant metal film 3.

Since the through via 15 has a frustoconical shape with a diameter (or a cross-sectional area) on the second surface 1b' side greater than a diameter (or a cross-sectional area) on the first surface 1a side, circulation of the etchant in the through via 15 is promoted, allowing the process to be efficiently performed. Furthermore, it is preferable that before the etching, ultrasonic cleaning or a plasma treatment in which one or more of CF4 gas, oxygen gas, argon gas, hydrogen gas, and the like are used be performed on a target portion as a pretreatment to improve the wettability; performing both the plasma treatment and the ultrasonic cleaning, which further increases wettability improvement effects, is more preferable.

In this manner, the etching residues of glass (also referred to as glass residues) and a portion of the metal film having a high resistivity can be removed simultaneously; therefore, the reliability of connection of the through via part can be improved, and the transmission characteristics and the electrical characteristics can be improved.

Subsequently, a copper film having a thickness in the range of 100 nm or more and 500 nm or less is formed by electroless plating or the like on the second surface 1b' with the through via 15 formed thereon, to form the seed layer 16 for power supply. The electroless plating is applied with the aim of improving the adhesion of the layer material to the undercut in this example, but the seed layer may be formed by sputtering depending on the shape.

With the hydrofluoric acid resistant metal film 3 that has been treated to have a thickness of at most 50% of the thickness of the hydrofluoric acid resistant metal film 3 that has not yet been treated, degradation of the electrical characteristics via the through via 15 can be reduced. However, when the thickness of the hydrofluoric acid resistant metal film 3 exceeds 50%, the removal may not be sufficient depending on the etching residues, which may cause the failure to provide adhesion to a metal or the failure to obtain good electrical characteristics, for example.

In the present embodiment, the length of time for etching the hydrofluoric acid resistant metal film 3 is longer than that in Embodiment 1B. Therefore, the corrosive solution passes through the hydrofluoric acid resistant metal film 3 and reaches the seed layer 4 located on the back side. Thus, the seed layer 16 for power supply is formed on the inner periphery of the through via 15 and is formed inside the opening extending through the hydrofluoric acid resistant metal film 3 and on a surface of the seed layer 4.

Figure 14:
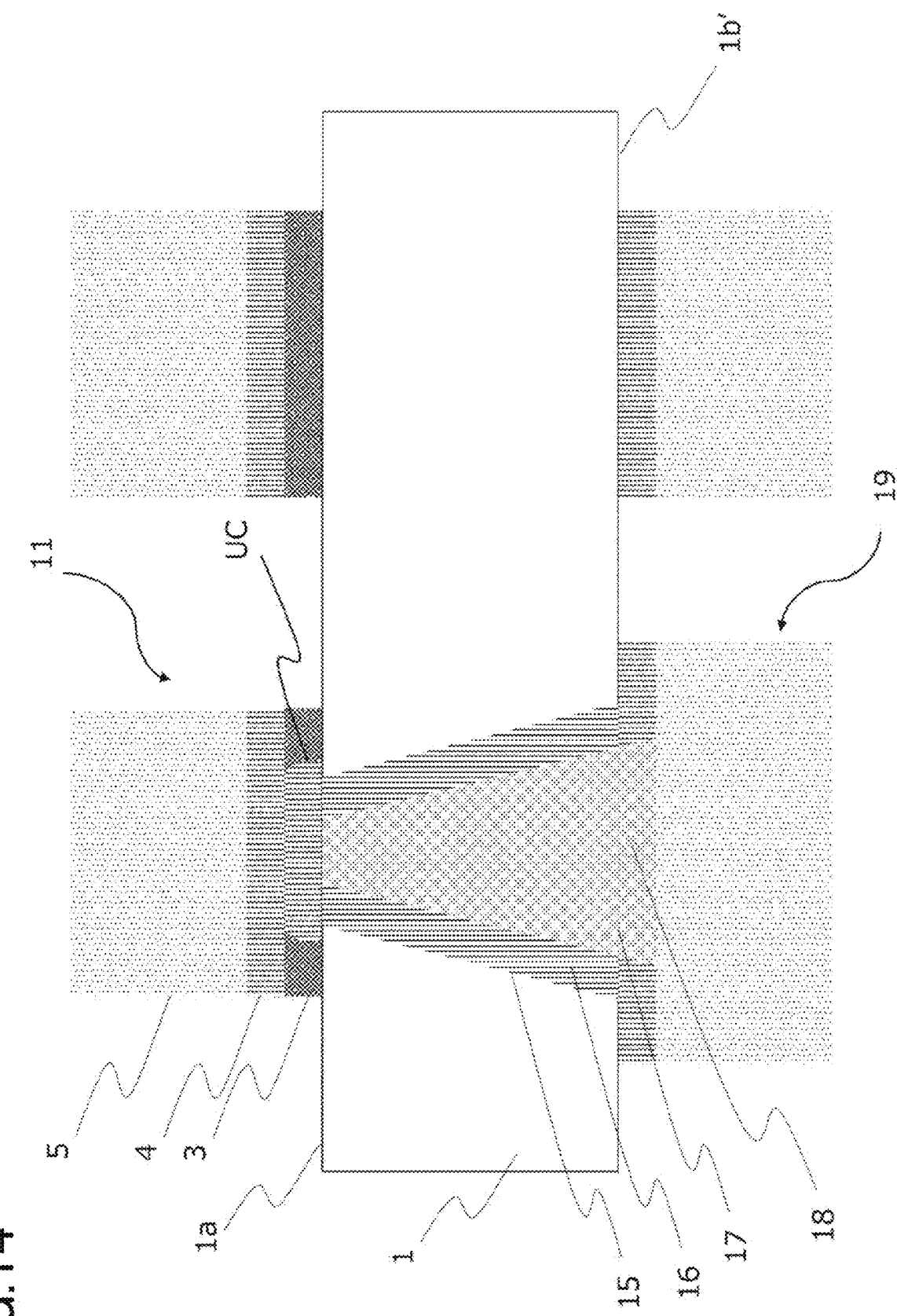
FIG. 14 is a cross-sectional view of a through via and its surroundings in a wiring board formed according to Embodiment 3B.

FIG. 14 is a cross-sectional view of the through via and its surroundings in the wiring board formed according to the present embodiment. With the wet etching process according to the present embodiment, the etching residues of glass and a portion of the hydrofluoric acid resistant metal film 3 having a high resistivity can be removed simultaneously; therefore, the reliability of connection of the through electrode 18 can be improved, and the transmission characteristics and the electrical characteristics can be improved. This allows improvements to the transmission characteristics, the electrical characteristics, etc., of the wiring on the glass substrate 1, the capacitor embedded in the glass substrate and connected to the through via, the inductor formed using the through via, and the LC filter composed of the capacitor and the inductor.

In other words, the seed layer 4 on the first surface 1a side of the glass substrate 1 and the seed layer 16 for power supply that extends from the second surface 1b' side through the through via 15 are, for example, made of the same material and directly connected without the hydrofluoric acid resistant metal film 3 interposed therebetween, leading to further improvements to the transmission characteristics and the electrical characteristics of the through electrode 18.

This allows improvements to the transmission characteristics, the electrical characteristics, etc., of the wiring on the glass substrate, the capacitor embedded in the glass substrate and connected to the through via, the inductor formed using the through via, and the LC filter composed of the capacitor and the inductor. Furthermore, since the hydrofluoric acid resistant metal film 3 is removed, it is no longer necessary to additionally perform processes for ensuring the adhesion to the hydrofluoric acid resistant metal film 3, such as the process of forming the adhesive layer, and an increase in the number of processes can be reduced.

Furthermore, by the wet etching process according to the present embodiment, the opening extends through the hydrofluoric acid resistant metal film 3, and the diameter of this opening can be increased so that the undercut UC is formed. The seed layer 16 for power supply is formed so as to fill the undercut UC, and therefore the upper end portion of the seed layer 16 is in the form of a disc having a diameter greater than the inner diameter of the upper end of the through via 15. Therefore, a force acting against the force applied to separate the seed layer 16 from the glass substrate 1 is greater than that according to Embodiment 1B.

Embodiment 5A

Next, Embodiment 5A of the present invention will be described. Embodiment 5A is different from Embodiment 3A described above only in Step 7 (step D); Steps 1 to 6 and Steps 8 to 10 are the same as those described above. Step 7 is the same as Step 7 according to Embodiment 2A. Thus, overlapping description will be omitted.

Embodiment 6A

Next, Embodiment 6A of the present invention will be described. Embodiment 6A is different from Embodiment 3A described above only in Step 7 (step D); Steps 1 to 6 and Steps 8 to 10 are the same as those described above. Step 7 is the same as Step 7 according to Embodiment 4A. Thus, overlapping description will be omitted.

Embodiment 7A

FIGS. 15(*a*)-15(*j*) are a set of diagrams illustrating steps in a wiring board manufacturing method according to Embodiment 7A. Embodiment 7A is different from Embodiment 1A in that the laser modification step in Step 1 is performed after the support is bonded to the glass substrate 1. Hereinafter, Embodiment 7A will be described with reference to FIGS. 15(*a*)-15(*j*).
(Step 1)

Alkali-free glass having a thickness of 500 μm is prepared, foreign matter on surfaces of the alkali-free glass is removed by ultrasonic cleaning or the like, and thus a glass substrate 1 is provided.

Furthermore, a hydrofluoric acid resistant metal film 3 having a thickness in the range of 10 nm or more and 500 nm or less is formed on the first surface 1*a* of the glass substrate 1 by sputtering or the like. Subsequently, a copper film having a thickness in the range of 100 nm or more and 500 nm or less is formed by sputtering, electroless plating, or the like on the hydrofluoric acid resistant metal film 3, and the seed layer 4 is formed on the hydrofluoric acid resistant metal film 3, as illustrated in FIG. 15(*a*). The material of the hydrofluoric acid resistant metal film 3 is selected, for example, from chromium, nickel, and nickel-chromium, as appropriate.

(Step 2)

Next, a photoresist for a pattern is formed on the first surface 1*a* of the glass substrate 1. As one example, the first surface 1*a*-side area is laminated with a dry photoresist (under the product name RD1225) produced by Showa Denko Materials Co., Ltd., the pattern is drawn, then development is performed, and thus the seed layer 4 is exposed. Electric power is supplied to the seed layer 4, and electrolytic copper plating is performed to form a copper layer having a thickness of 2 μm or more and 10 μm or less. After the plating, a dry film resist that is no longer necessary is dissolved away, the seed layer 4 is etched, and thus a wiring including the hydrofluoric acid resistant metal film 3, the seed layer 4, and the copper layer 5 laminated on each other is formed on the first surface 1*a*, as illustrated in FIG. 15(*b*).

Here, in addition to the wiring, a capacitor may also be formed on the first surface 1*a*. The capacitor has a MIM structure in which a dielectric is sandwiched between two conducting plates, as mentioned earlier. An example of the capacitor is shown in FIG. 2, in which a lower electrode 6 is formed directly on the glass substrate 1 or on an insulating resin layer formed on the glass substrate 1, a dielectric 7 is laminated on the lower electrode 6, and furthermore, an upper electrode 8 is laminated on the dielectric 7. Each of the lower electrode 6 and the upper electrode 8 generally has a multilayer structure including: a seed layer that is a thin metal film formed by the above-mentioned electroless nickel plating, sputtering, or the like; and a conductive layer formed on the seed layer from electrolytic copper plating or the like. The capacitance of the capacitor is determined according to the permittivity of the dielectric 7, the area of the upper electrode 8 overlapping with the lower electrode 6, and the distance between the lower electrode 6 and the upper electrode 8. The capacitor can be provided on either side, the first surface 1*a* or the second surface 1*b'*, of the glass substrate 1.

Furthermore, the lower electrode 6 may be formed at any position, but in the case where a wire is connected from the lower electrode 6 to the second surface 1*b'* of the glass substrate 1, the lower electrode 6 is preferably formed directly above the through via 15, as illustrated in FIG. 2, in order to reduce the electrical resistance of the wire and shorten the length of the wire.
(Step 3)

Next, as one example, the wire is laminated with an insulating resin 9 (32.5 μm-thick under the product name ABF-GXT31) produced by Ajinomoto Fine-Techno Co., Inc., pre-curing is performed, and then a blind via is formed in the insulating resin 9 using laser machining. Subsequently, a de-smear process is performed so that any smears produced by the laser are removed, a copper film having a thickness in the range of 100 nm or more and 500 nm or less is formed by sputtering and electroless plating, and thus a seed layer is formed. The seed layer is laminated with a dry film resist (under the product name RD1225) produced by Showa Denko Materials Co., Ltd., a pattern is drawn, and then development is performed. Electric power is supplied to the seed layer, and electrolytic copper plating is performed to form a copper layer having a thickness of 2 μm or more and 10 μm or less. After the plating, the dry film resist that is no longer needed is dissolved away, the seed layer is etched, and thus a wiring is formed. After the wire is formed, a solder resist 10 is formed, patterning is performed using photolithography or the like, and thus a first surface wiring layer 11, which is wiring on the first surface 1*a* side, is formed, as illustrated in FIG. 15(c). Furthermore, when an external connection terminal 12 or the like is needed, an opening may be provided.

Note that in the present embodiment, the step of forming the first surface wiring layer including the hydrofluoric acid resistant metal film and the copper layer on the first surface of the glass substrate is referred to as a step B. The step B corresponds to Steps 1 to 3 described above, but the disclosure of Steps 1 to 3 does not limit the step B.

(Step 4)

Next, as illustrated in FIG. 15(d), the glass carrier 14 is bonded onto the first surface wiring layer 11 using the adhesive 13 for temporary bonding (for example, under the product name REVALPHA produced by Nitto Denko Corporation). The glass carrier 14 desirably has a thickness in the range of 0.7 mm or more and 10 mm or less in view of transportability thereof after being reduced in thickness. The thickness of the glass carrier 14 may be set, as appropriate, according to the thickness of the glass substrate 1. The glass carrier 14 is illustrated as the support, but the support is not required to be made of glass and may be made of a metal, a resin, or the like.

(Step 5)

Next, as illustrated in FIG. 15(e), laser light is emitted from the surface 1b, which is opposite to the first surface 1a, of the glass substrate 1, and the laser-modified portion 2, which is a starting point of a through via, is formed. The laser-modified portion 2 is formed vertically with respect to the hydrofluoric acid resistant metal film 3 formed in Step 1, and the amount of laser light is adjusted so that the lower end of the laser-modified portion 2 is within the glass substrate 1. The laser light used is the same as that used in Embodiment 1A.

Note that in the present embodiment, the step of forming the laser-modified portion by emitting the laser light from one surface to the other surface of the glass substrate is referred to as a step A. The step A corresponds to Step 5 described above, but the disclosure of Step 5 does not limit the step A.

(Step 6)

Next, using a hydrogen fluoride solution, etching is performed from the surface 1b of the glass substrate 1, which is located on the opposite side from the first surface wiring layer 11. The glass in the area where the laser-modified portion 2 has not been formed is etched using the hydrogen fluoride solution, so that the thickness thereof is reduced while the processed glass substrate 1 has a surface opposite which remains parallel with the first surface 1a of the glass substrate 1, as illustrated in FIG. 15(f). When the hydrogen fluoride solution comes into contact with the laser-modified portion 2, the laser-modified portion 2 is dissolved preferentially, and thus the through via 15 is formed. In this manner, the glass substrate 1 is reduced in thickness while the through via 15 is formed therein. In other words, the thickness of the glass substrate 1 is reduced and the through via 15 is formed in one etching process. The lower surface of the glass substrate 1 that has been reduced in thickness is the second surface 1b' on which a second surface wiring layer is to be formed. The hydrogen fluoride solution used is the same as that used in Embodiment 1A.

Note that in the present embodiment, the step of forming the through via 15 in the laser-modified portion 2 and forming the second surface 1b' of the glass substrate 1, which is opposite to the first surface 1a, by etching the surface opposite to the first surface 1a is referred to as a step C. The step C corresponds to Step 6 described above, but the disclosure of Step 6 does not limit the step C, which is the same as in Embodiment 1.

(Step 7: Through Via Treatment Step)

Furthermore, in the present embodiment, in order to remove etching residues of glass adhered to the hydrofluoric acid resistant metal film 3 (also referred to as glass residues), a surface modification treatment is performed as a through via treatment step. More specifically, the through via 15 is irradiated with plasma (subjected to a plasma treatment) while one or more of CF4 gas, oxygen gas, argon gas, hydrogen gas, and the like are supplied to the through via 15, and thus the etching residues of glass adhered to the hydrofluoric acid resistant metal film 3 are removed, and moreover the wettability of a surface of the hydrofluoric acid resistant metal film 3 is improved. In this manner, the etching residues of glass can be removed and therefore, the reliability of connection of the through via part can be improved, and the transmission characteristics and the electrical characteristics can be improved.

Subsequently, sputtering or the like is performed on the second surface 1b' with the through via 15 formed thereon, and thus a copper film having a thickness in the range of 100 nm or more and 500 nm or less is formed on the inner surface of the through via 15 to form the seed layer 16 for power supply. Since the through via 15 has a frustoconical shape, film-forming particles that are scattered linearly are kept from being blocked, which allows the seed layer to be efficiently formed. In this regard, the seed layer may be formed by electroless plating.

Note that in the present embodiment, the step of removing the etching residues of glass adhered to the hydrofluoric acid resistant metal film is referred to as a through via treatment step D. The through via treatment step D corresponds to Step 7 described above, but the disclosure of Step 7 does not limit the through via treatment step D.

Also in the present embodiment, similarly to the embodiment illustrated in FIG. 6, the etching residues of glass adhered to the hydrofluoric acid resistant metal film 3 have been removed by the surface modification process, and thus the hydrofluoric acid resistant metal film 3 exposed in the through via 15 and the seed layer 16 are completely in contact, allowing improvements to the transmission characteristics, the electrical characteristics, etc., between the first surface 1a and the second surface 1b' of the wiring board. This allows improvements to the transmission characteristics, the electrical characteristics, etc., of the wiring on the glass substrate 1, the capacitor embedded in the glass substrate 1 and connected to the through via 15, the inductor formed using the through via 15, and the LC filter composed of the capacitor and the inductor.

Furthermore, according to the present embodiment, two or more conductor layers (the seed layer 4) including the hydrofluoric acid resistant metal film 3 are formed between the through electrode 18 and the copper layer 5, and by forming the hydrofluoric acid resistant metal film 3 on the first surface 1a of the glass substrate 1, it is possible to improve the adhesion of the copper layer 5.

(Step 8)

Next, similarly to Step 2 and Step 3, a pattern is formed on the second surface 1b' using a dry film resist, electric power is supplied to the seed layer 16, electrolytic copper plating is performed to form a copper layer 17 having a thickness of 2 μm or more and 10 μm or less, then the dry film resist that is no longer needed is dissolved away, and thus a through electrode 18 is formed, as illustrated in FIG. 15(g). Subsequently, the seed layer 16 is removed at portions that are no longer needed, an outer layer protective film such as the solder resist 10 or the insulating resin 9 is applied as a coating, and thus a second surface wiring layer 19 is formed, as illustrated in FIG. 15(h). Furthermore, when an external connection terminal 12 or the like is needed, an opening may be provided. Regarding the through electrode 18, the second surface wiring layer 19, and the like, those described in Embodiment 1A hold true as just described.

Note that in the present embodiment, the step of forming the through electrode in the through via is referred to as a step E. The step E corresponds to Step 8 described above, but the disclosure of Step 8 does not limit the step E.

Here, in addition to the wiring, a capacitor and an inductor may also be formed on the second surface 1b'. With the inductor, the glass substrate 1 having the through via 15 can incorporate features that are substantially the same as those of a spiral coil. FIG. 4 provides an illustration in which the flat glass substrate 1 including two rows of the through vias 15 is transparent and a spiral coil is formed using the through vias 15 formed in the glass substrate. Specifically, on the front and back sides (1a, 1b') of the glass substrate 1 not illustrated in the drawing, wirings 27 are formed so as to connect the opening parts of the through vias 15 adjacent to each other in the direction in which the spiral coil is wound. Furthermore, a conductor layer is formed on the inner wall of the through via 15 that connects the front and back sides of the glass substrate 1, and thus the through electrode 18 is formed.

The spiral coil can be fabricated by sequentially connecting the wirings 27, which are formed on the front and back sides (1a, 1b') of the glass substrate 1, in series by the through electrodes 18 in this manner. The properties of the inductor can be adjusted by changing the number of turns, for example. The form of the inductor is not limited to the form described thus far; a coil may be formed in a spiral form by machining the first surface wiring layer 11 and the second surface wiring layer 19 of the glass substrate 1 as with other wirings, or a coil spirally wound around the insulating resin 9 may be formed by providing wirings on each of two conductor layers sandwiching the insulating resin 9, forming the blind vias and the through electrodes in the insulating resin 9, and connecting the wirings on both the conductor layers by the through electrodes.

Furthermore, the through electrode 18 can be selectively in a conformal form in which the copper layer 17, which is an electrolytic plating film, is formed along the side wall of the through via 15 and the through via 15 is filled with the insulating resin 9, as illustrated in FIGS. 5A(a) and 5A(b), or in a filled form in which the whole inside of the through via 15 is formed of the copper layer 17, which is an electrolytic plating film, as illustrated in FIGS. 5B(a) and 5B(b). Note that with the filled form illustrated in FIGS. 5B(a) and 5B(b), because the whole inside of the through via 15 is formed of the copper layer 17 having a low electrical resistance, the through electrode 18 has improved electrical characteristics, transmission characteristics, etc., as compared to that with the conformal form illustrated in FIGS. 5A(a) and 5A(b).

The seed layer 16 for power supply on the second surface 1b' is a metal layer made of a material different from the material of the hydrofluoric acid resistant metal film 3 because the subsequent steps do not include an etching process in which the hydrogen fluoride solution is used. Examples of the material different from hydrofluoric acid resistant metals include Ti, Cu, and electroless Ni, and at least one metal layer made from such a material is formed at least on the inner peripheral surface of the through via 15.

The material, the number of layers, and so on are not limited to those indicated above; as illustrated in FIG. 15(h), the material, the number of layers to be laminated, and so on may be set as required. As the first surface wiring layer 11 and the second surface wiring layer 19, at least one layer is laminated; the number of layers to be laminated may be set as required. Furthermore, in the first surface wiring layer 11 and the second surface wiring layer 19, a spiral coil element (a coil) in a planar form (for example, in a spiral form), the aforementioned MIM capacitor element, and the like can also be formed on the insulating resin 9. Furthermore, as mentioned above, when the external connection terminal 12 or the like is needed, an opening may be provided.

(Step 9)

Furthermore, as illustrated in FIG. 15(i), the glass carrier 14 temporarily bonded in Step 5 is removed, and thus the wiring board 20 having, on both sides, the first surface wiring layer 11 and the second surface wiring layer 19 electrically connected by the through electrode 18 is completed. Note that two or more wiring layers may be further formed on the front and back of the wiring board 20 by the method in Step 3 after Step 9. After Step 9, because the glass carrier 14 has been removed, the wiring layers can be formed on both sides at the same time, enabling a reduction in steps as compared to the case of per-side formation. Furthermore, in Step 9, because the wiring layers have been formed on the front and back of the glass substrate 1, the wiring board 20 has improved mechanical strength as compared to the glass substrate 1 alone, and occurrences of glass cracking during the transport step for forming a conductive part such as a circuit can be reduced. Moreover, the external connection terminal 12 can also be formed on the wiring board and furthermore, a solder ball 21 can also be formed on the external connection terminal 12.

(Step 10)

As illustrated in FIG. 15(j), a semiconductor chip 22 and a chip component 23 are mounted on one side or both sides of the wiring board 20 using an existing packaging technique, and thus a high-frequency device 24 is completed.

Embodiment 5B

FIGS. 16(a)-16(k) are a set of diagrams illustrating steps in a wiring board manufacturing method according to Embodiment 5B. Embodiment 5B is different from Embodiment 1B in that the laser modification step in Step 1 is performed after the support is bonded to the glass substrate 1. Hereinafter, Embodiment 5B will be described with reference to FIGS. 16(a)-16(k).

(Step 1)

Alkali-free glass having a thickness of 500 μm is prepared, foreign matter on surfaces of the alkali-free glass is removed by ultrasonic cleaning or the like, and thus a glass substrate 1 is provided.

Furthermore, a hydrofluoric acid resistant metal film 3 having a thickness in the range of 10 nm or more and 500 nm or less is formed on the first surface 1a of the glass substrate 1 by sputtering or the like. Subsequently, a copper film having a thickness in the range of 100 nm or more and 500 nm or less is formed by sputtering, electroless plating, and the like on the hydrofluoric acid resistant metal film 3, and the seed layer 4 is formed on the hydrofluoric acid resistant metal film 3, as illustrated in FIG. 16(a). The material of the hydrofluoric acid resistant metal film 3 is selected, for example, from chromium, nickel, and nickel-chromium, as appropriate.

(Step 2)

Next, a photoresist for a pattern is formed on the first surface 1a of the glass substrate 1. As one example, the first surface 1a-side area is laminated with a dry photoresist (under the product name RD1225) produced by Showa Denko Materials Co., Ltd., the pattern is drawn, then development is performed, and thus the seed layer 4 is exposed. Electric power is supplied to the seed layer 4, and electrolytic copper plating is performed to form a copper layer having a thickness of 2 μm or more and 10 μm or less. After the plating, a dry film resist that is no longer necessary is dissolved away, the seed layer 4 is etched, and thus a wiring including the hydrofluoric acid resistant metal film 3, the seed layer 4, and the copper layer 5 laminated on each other is formed on the first surface 1a, as illustrated in FIG. 16(b).

Here, in addition to the wiring, a capacitor may also be formed on the first surface 1a. The capacitor has a MIM structure in which a dielectric is sandwiched between two conducting plates, as mentioned earlier. An example of the capacitor is shown in FIG. 2, in which a lower electrode 6 is formed directly on the glass substrate 1 or on an insulating resin layer formed on the glass substrate 1, a dielectric 7 is laminated on the lower electrode 6, and furthermore, an upper electrode 8 is laminated on the dielectric 7. Each of the lower electrode 6 and the upper electrode 8 generally has a multilayer structure including: a seed layer that is a thin metal film formed by the above-mentioned electroless nickel plating, sputtering, or the like; and a conductive layer formed on the seed layer from electrolytic copper plating or the like. The capacitance of the capacitor is determined according to the permittivity of the dielectric 7, the area of the upper electrode 8 overlapping with the lower electrode 6, and the distance between the lower electrode 6 and the upper electrode 8. The capacitor can be provided on either side, the first surface 1a or the second surface 1b', of the glass substrate 1.

Furthermore, the lower electrode 6 may be formed at any position, but in the case where a wire is connected from the lower electrode 6 to the second surface 1b' of the glass substrate 1, the lower electrode 6 is preferably formed directly above the through via 15, as illustrated in FIG. 2, in order to reduce the electrical resistance of the wire and shorten the length of the wire.

(Step 3)

Next, as one example, the wire is laminated with an insulating resin 9 (32.5 μm-thick under the product name ABF-GXT31) produced by Ajinomoto Fine-Techno Co., Inc., pre-curing is performed, and then a blind via is formed in the insulating resin 9 using laser machining. Subsequently, a de-smear process is performed so that any smears produced by the laser are removed, a copper film having a thickness in the range of 100 nm or more and 500 nm or less is formed by sputtering and electroless plating, and thus a seed layer is formed. The seed layer is laminated with a dry film resist (under the product name RD1225) produced by Showa Denko Materials Co., Ltd., a pattern is drawn, and then development is performed. Electric power is supplied to the seed layer, and electrolytic copper plating is performed to form a copper layer having a thickness of 2 μm or more and 10 μm or less. After the plating, the dry film resist that is no longer needed is dissolved away, the seed layer is etched, and thus a wiring is formed. After the wiring is formed, a solder resist 10 is formed, patterning is performed using photolithography or the like, and thus a first surface wiring layer 11, which is wiring on the first surface 1a side, is formed, as illustrated in FIG. 16(c). Furthermore, when an external connection terminal 12 or the like is needed, an opening may be provided.

Note that in the present embodiment, the step of forming the first surface wiring layer including the hydrofluoric acid resistant metal film and the copper layer on the first surface of the glass substrate is referred to as a step B. The step B corresponds to Steps 1 to 3 described above, but the disclosure of Steps 1 to 3 does not limit the step B.

(Step 4)

Next, as illustrated in FIG. 16(d), the glass carrier 14 is bonded onto the first surface wiring layer 11 using the adhesive 13 for temporary bonding (for example, under the product name REVALPHA produced by Nitto Denko Corporation). The glass carrier 14 desirably has a thickness in the range of 0.7 mm or more and 10 mm or less in view of transportability thereof after being reduced in thickness. The thickness of the glass carrier 14 may be set, as appropriate, according to the thickness of the glass substrate 1. The glass carrier 14 is illustrated as the support, but the support is not required to be made of glass and may be made of a metal, a resin, or the like.

(Step 5)

Next, as illustrated in FIG. 16(e), laser light is emitted from the surface 1b, which is opposite to the first surface 1a, of the glass substrate 1, and the laser-modified portion 2, which is a starting point of a through via, is formed. The laser-modified portion 2 is formed vertically with respect to the hydrofluoric acid resistant metal film 3 formed in Step 1, and the amount of laser light is adjusted so that the lower end of the laser-modified portion 2 is within the glass substrate 1. The laser light used is the same as that used in Embodiment 1A.

Note that in the present embodiment, the step of forming the laser-modified portion by emitting the laser light from one surface to the other surface of the glass substrate is referred to as a step A. The step A corresponds to Step 5 described above, but the disclosure of Step 5 does not limit the step A.

(Step 6)

Next, using a hydrogen fluoride solution, etching is performed from the surface 1b of the glass substrate 1, which is located on the opposite side from the first surface wiring layer 11. The glass in the area where the laser-modified portion 2 has not been formed is etched using the hydrogen fluoride solution, so that the thickness thereof is reduced while the processed glass substrate 1 has a surface opposite which remains parallel with the first surface 1a of the glass substrate 1, as illustrated in FIG. 16(f). When the hydrogen fluoride solution comes into contact with the laser-modified portion 2, the laser-modified portion 2 is dissolved preferentially, and thus the through via 15 is formed. In this manner, the glass substrate 1 is reduced in thickness while the through via 15 is formed therein. In other words, the thickness of the glass substrate 1 is reduced and the through via 15 is formed in one etching process. The lower surface of the glass substrate 1 that has been reduced in thickness is the second surface 1b' on which a second surface wiring layer is to be formed. The hydrogen fluoride solution used is the same as that used in Embodiment 1A.

Note that in the present embodiment, the step of forming the through via 15 in the laser-modified portion 2 and forming the second surface 1b' of the glass substrate 1, which is opposite to the first surface 1a, by etching the surface opposite to the first surface 1a is referred to as a step C. The step C corresponds to Step 6 described above, but the disclosure of Step 6 does not limit the step C, which is the same as in Embodiment 1.

(Step 7: Through Via Treatment Step (Wet Etching Process))

Furthermore, in the present embodiment, as illustrated in FIG. 16(g), a portion of the hydrofluoric acid resistant metal film 3 region exposed from the through via 15 formed using the hydrogen fluoride solution is removed by a wet etching process that is a through via treatment step. The method for the removal is not specified; any wet method in which the hydrofluoric acid resistant metal film can be removed using a corrosive solution can be used, and a chromium etchant, for example, is preferably used. Specifically, as a result of diligent research, from the perspective of etching selectivity of the hydrofluoric acid resistant metal film 3 to be etched and the glass, the copper, the insulating resin, etc., that are different from the hydrofluoric acid resistant metal film 3 and do not need to be etched, the treatment is performed at a temperature of 40° C. for 1.5 minutes using an alkaline chromium etchant produced by Nihon Kagaku Sangyo Co., Ltd. and containing potassium ferricyanide and potassium hydroxide. This allows only the hydrofluoric acid resistant metal film 3 to be etched without causing damage to the glass substrate 1, the insulating resin 9, etc., other than the hydrofluoric acid resistant metal film 3.

Since the through via 15 has a frustoconical shape with a diameter (or a cross-sectional area) on the second surface 1b' side greater than a diameter (or a cross-sectional area) on the first surface 1a side, circulation of the etchant in the through via 15 is promoted, allowing the process to be efficiently performed. Furthermore, it is preferable that before the etching, ultrasonic cleaning or a plasma treatment in which one or more of CF4 gas, oxygen gas, argon gas, hydrogen gas, and the like are used be performed on a target portion as a pretreatment to improve the wettability; performing both the plasma treatment and the ultrasonic cleaning, which further increases wettability improvement effects, is more preferable.

In this manner, the etching residues of glass (also referred to as glass residues) and a portion of the metal film having a high resistivity can be removed simultaneously; therefore, the reliability of connection of the through via part can be improved, and the transmission characteristics and the electrical characteristics can be improved.

Subsequently, a copper film having a thickness in the range of 100 nm or more and 500 nm or less is formed by electroless plating or the like on the second surface 1b' with the through via 15 formed thereon, to form the seed layer 16 for power supply. The electroless plating is applied with the aim of improving the adhesion of the layer material to the undercut in this example, but the seed layer may be formed by sputtering depending on the shape.

With the hydrofluoric acid resistant metal film 3 that has been treated to have a thickness of at most 50% of the thickness of the hydrofluoric acid resistant metal film 3 that has not yet been treated, degradation of the electrical characteristics via the through via 15 can be reduced. However, when the thickness of the hydrofluoric acid resistant metal film 3 exceeds 50%, the removal may not be sufficient depending on the etching residues, which may cause the failure to provide adhesion to a metal or the failure to obtain good electrical characteristics, for example.

Note that in the present embodiment, the step of removing a portion of the hydrofluoric acid resistant metal film 3 is referred to as a through via treatment step D. The through via treatment step D corresponds to Step 7 described above, but the disclosure of Step 7 does not limit the through via treatment step D.

Also in the present embodiment, similarly to the embodiment illustrated in FIG. 6, the undercut UC is formed in the hydrofluoric acid resistant metal film 3 by the wet etching process, and therefore the area of contact between the hydrofluoric acid resistant metal film 3 and the seed layer 16 can be increased, allowing improvements to the transmission characteristics, the electrical characteristics, etc., between the first surface 1a and the second surface 1b' of the wiring board. This allows improvements to the transmission characteristics, the electrical characteristics, etc., of the wiring on the glass substrate 1, the capacitor embedded in the glass substrate and connected to the through via 15, the inductor formed using the through via 15, and the LC filter composed of the capacitor and the inductor.

In contrast, in the present embodiment, since the hydrofluoric acid resistant metal film 3 includes the undercut UC, an upper end portion of the seed layer 16 extends to the outside of the upper edge of the through via 15 and comes into close contact with the hydrofluoric acid resistant metal film 3. In other words, the maximum outer diameter of the upper end of the seed layer 16 is greater than the largest inner diameter of the upper end of the through via 15, and therefore even when a force is applied to separate the seed layer 16 from the glass substrate 1, the seed layer 16 can withstand this force.

(Step 8)

Next, similarly to Step 2 and Step 3, a pattern is formed on the second surface 1b' using a dry film resist, electric power is supplied to the seed layer 16, electrolytic copper plating is performed to form a copper layer 17 having a thickness of 2 μm or more and 10 μm or less, then the dry film resist that is no longer needed is dissolved away, and thus the through electrode 18 is formed, as illustrated in FIG. 16(h). Subsequently, the seed layer 16 is removed at portions that are no longer needed, an outer layer protective film such as the solder resist 10 or the insulating resin 9 is applied as a coating, and thus a second surface wiring layer 19 is formed, as illustrated in FIG. 16(i). Furthermore, when an external connection terminal 12 or the like is needed, an opening may be provided. Regarding the through electrode 18, the second surface wiring layer 19, and the like, those described in Embodiment 1B hold true as just described.

Note that in the present embodiment, the step of forming the through electrode in the through via is referred to as a step E. The step E corresponds to Step 8 described above, but the disclosure of Step 8 does not limit the step E.

Here, in addition to the wiring, a capacitor and an inductor may also be formed on the second surface 1b'. With the inductor, the glass substrate 1 having the through via 15 can incorporate features that are substantially the same as those of a spiral coil. FIG. 4 provides an illustration in which the flat glass substrate 1 including two rows of the through vias 15 is transparent and a spiral coil is formed using the through vias 15 formed in the glass substrate. Specifically, on the front and back sides (1a, 1b') of the glass substrate 1 not illustrated in the drawing, wirings 27 are formed so as to connect the opening parts of the through vias 15 adjacent to each other in the direction in which the spiral coil is wound. Furthermore, a conductor layer is formed on the inner wall of the through via 15 that connects the front and back sides (1a, 1b') of the glass substrate 1, and thus the through electrode 18 is formed.

The spiral coil can be fabricated by sequentially connecting the wirings 27, which are formed on the front and back sides (1a, 1b') of the glass substrate 1, in series by the through electrodes 18 in this manner. The properties of the inductor can be adjusted by changing the number of turns, for example. The form of the inductor is not limited to the form described thus far; a coil may be formed in a spiral form by machining the first surface wiring layer 11 and the second surface wiring layer 19 of the glass substrate 1 as with other wirings, or a coil spirally wound around the insulating resin 9 may be formed by providing wirings on each of two conductor layers sandwiching the insulating resin 9, forming the blind vias and the through electrodes in the insulating resin 9, and connecting the wirings on both the conductor layers by the through electrodes.

Furthermore, the through electrode 18 can be selectively in a conformal form in which the copper layer 17, which is an electrolytic plating film, is formed along the side wall of the through via 15 and the through via 15 is filled with the insulating resin 9, as illustrated in FIGS. 5A(a) and 5A(b), or a filled form in which the whole inside of the through via 15 is formed of the copper layer 17, which is an electrolytic plating film, as illustrated in FIGS. 5B(a) and 5B(b). Note that with the filled form illustrated in FIGS. 5B(a) and 5B(b), because the whole inside of the through via 15 is formed of the copper layer 17 having a low electrical resistance, the through electrode 18 has improved electrical characteristics, transmission characteristics, etc., as compared to that with the conformal form illustrated in FIGS. 5A(a) and 5A(b).

The seed layer 16 for power supply on the second surface 1b' is a metal layer made of a material different from the material of the hydrofluoric acid resistant metal film 3 because the subsequent steps do not include an etching process in which the hydrogen fluoride solution is used. Examples of the material different from hydrofluoric acid resistant metals include Ti, Cu, and electroless Ni, and at least one metal layer made from such a material is formed at least on the inner peripheral surface of the through via 15.

The material, the number of layers, and so on are not limited to those indicated above; as illustrated in FIG. 16(i), the material, the number of layers to be laminated, and so on may be set as required. As the first surface wiring layer 11 and the second surface wiring layer 19, at least one layer is laminated; the number of layers to be laminated may be set as required. Furthermore, in the first surface wiring layer 11 and the second surface wiring layer 19, a spiral coil element (a coil) in a planar form (for example, in a spiral form), the aforementioned MIM capacitor element, and the like can also be formed on the insulating resin 9. Furthermore, as mentioned above, when the external connection terminal 12 or the like is needed, an opening may be provided.
(Step 9)

Furthermore, as illustrated in FIG. 16(j), the glass carrier 14 temporarily bonded in Step 5 is removed, and thus the wiring board 20 having, on both sides, the first surface wiring layer 11 and the second surface wiring layer 19 electrically connected by the through electrode 18 is completed. Note that two or more wiring layers may be further formed on the front and back of the wiring board 20 by the method in Step 3 after Step 9. After Step 9, because the glass carrier 14 has been removed, the wiring layers can be formed on both sides at the same time, enabling a reduction in steps as compared to the case of per-side formation. Furthermore, in Step 9, because the wiring layers have been formed on the front and back of the glass substrate 1, the wiring board has improved mechanical strength as compared to the glass substrate 1 alone, and occurrences of glass cracking during the transport step for forming a conductive part such as a circuit can be reduced. Moreover, the external connection terminal 12 can also be formed on the wiring board and furthermore, a solder ball 21 can also be formed on the external connection terminal 12.
(Step 10)

As illustrated in FIG. 16(k), the semiconductor chip 22 and the chip component 23 are mounted on one side or both sides of the wiring board 20 using an existing packaging technique, and thus the high-frequency device 24 is completed.

Embodiment 8A

Next, FIGS. 17(a)-17(k) are a set of diagrams illustrating steps in a wiring board manufacturing method according to Embodiment 8A. Embodiment 8A will be described with reference to FIGS. 17(a)-17(k). Embodiment 8A is different from Embodiment 3A in that the laser modification step in Step 1 is performed after the support is bonded to the glass substrate 1. Therefore, Embodiment 8A is different from Embodiment 3A described above only in Step 1 and Step 6; Steps 2 to 5 and Steps 7 to 10 are the same as those described above, and thus overlapping description will be omitted.
(Step 1)

Alkali-free glass having a thickness of 130 μm is prepared, foreign matter on surfaces of the alkali-free glass is removed by ultrasonic cleaning or the like, and thus a glass substrate 1 is provided. Subsequently, as illustrated in FIG. 17(a), the glass substrate securing glass carrier 26 is bonded onto the surface 1b opposite to the first surface using the adhesive 25 for temporary bonding. The glass substrate securing glass carrier 26 desirably has a thickness in the range of 0.7 mm or more and 10 mm or less in view of the transportability thereof during machining. The thickness of the glass substrate securing glass carrier 26 may be set, as appropriate, according to the thickness of the glass substrate 1. The glass substrate securing glass carrier 26 is illustrated as the support, but the support is not required to be made of glass and may be made of a metal, a resin, or the like. Step X corresponds to Step 1 described above, but the disclosure of Step 1 does not limit Step X.
(Step 6)

As illustrated in FIG. 17(e), laser light is emitted from the surface 1b, which is opposite to the first surface 1a, of the glass substrate 1, and the laser-modified portion 2, which is a starting point of a through via, is formed (Step A). The amount of laser light is adjusted so that the laser-modified portion 2 extends from the surface 1b, which is opposite to the first surface, to the surface 1a, which is vertically opposite, for example, and that an end of the laser-modified portion 2 passes through the glass substrate 1 and is within the glass substrate securing glass carrier 26. The laser light used is the same as that used in Embodiment 1A. Subsequently, the step of forming the first surface wiring layer as described above (step B) is performed.

Furthermore, as illustrated in FIG. 17(f), the glass substrate securing glass carrier 26 that has been temporarily bonded in Step 1 is removed (separated and removed), and the glass substrate 1 is exposed (Step Y). Next, using a hydrogen fluoride solution, etching is performed from the surface 1b of the glass substrate 1, which is located on the opposite side from the first surface wiring layer 11 (Step C). The surface 1b of the glass substrate 1 is etched using the hydrogen fluoride solution, so that the thickness thereof is reduced while the processed glass substrate 1 has a surface opposite which remains parallel with the first surface 1a of the glass substrate 1, as illustrated in FIG. 17(g). When the hydrogen fluoride solution comes into contact with the laser-modified portion 2, the laser-modified portion 2 is dissolved preferentially, and thus the through via 15 is formed. In this manner, the glass substrate 1 is reduced in thickness while the through via 15 is formed therein. In other words, the thickness of the glass substrate 1 is reduced and the through via 15 is formed in one etching process. The lower surface of the glass substrate 1 that has been reduced in thickness is the second surface 1b' on which a second surface wiring layer is to be formed. The through via 15 has a frustoconical shape with a diameter (or a cross-sectional area) on the second surface 1b' side greater than a diameter (or a cross-sectional area) on the first surface 1a side. Subsequently, the through via treatment step (Step D) and the through electrode formation step (Step E) are performed as described above.

Furthermore, depending on various etching conditions such as the modification position of the laser-modified portion, the concentration of the hydrogen fluoride solution, and the processing temperature, the cross-sectional shape of the through via 15 can be determined from among: (a) the shape of a letter V such that the diameter on the first surface 1a side is less than the diameter on the second surface 1b' side, as mentioned earlier; (b) the shape of a letter X such that a maximum cross-sectional area is provided on one of the first surface 1a side and the second surface 1b' side and a minimum cross-sectional area is provided at a distance of 0.4 T or more and 0.6 T or less from the first surface 1a where T is the thickness of the glass substrate 1; and (c) the shape of a bottleneck such that a maximum cross-sectional area is provided on one of the first surface 1a side and the second surface 1b' side and a minimum cross-sectional area is provided at a distance of greater than 0 and 0.2 T or less from the first surface 1a where T is the thickness of the glass substrate 1, as illustrated in FIGS. 3(a)-3(c).

When the glass substrate 1 is formed on the glass substrate securing glass carrier 26, laser-modified portions are formed, and before the etching in which the hydrogen fluoride solution is used, the glass substrate securing glass carrier 26 is removed, the laser-modified portions 2 of the glass substrate 1 are formed for the entire depth, meaning that there is less variation in depth among the modified portions as compared to Embodiment 1A. Therefore, there is less variation in diameter among through vias that are formed after the etching in which the hydrogen fluoride solution is used, leading to improved machining accuracy.

Embodiment 9A

Next, Embodiment 9A of the present invention will be described. Embodiment 9A is different from Embodiment 7A described above only in Step 7 (step D); Steps 1 to 6 and Steps 8 to 10 are the same as those described above. Step 7 is the same as Step 7 according to Embodiment 2A. Thus, overlapping description will be omitted.

Embodiment 10A

Next, Embodiment 10A of the present invention will be described. Embodiment is different from Embodiment 7A described above only in Step 7 (step D); Steps 1 to 6 and Steps 8 to 10 are the same as those described above. Step 7 is the same as Step 7 according to Embodiment 4A. Thus, overlapping description will be omitted.

Embodiment 11A

Next, Embodiment 11A of the present invention will be described. Embodiment 11A is different from Embodiment 8A described above only in Step 7 (step D); Steps 1 to 6 and Steps 8 to 10 are the same as those described above. Step 7 is the same as Step 7 according to Embodiment 2A. Thus, overlapping description will be omitted.

Embodiment 12A

Next, Embodiment 12A of the present invention will be described. Embodiment 12A is different from Embodiment 8A described above only in Step 7 (step D); Steps 1 to 6 and Steps 8 to 10 are the same as those described above. Step 7 is the same as Step 7 according to Embodiment 4A. Thus, overlapping description will be omitted.

Embodiment 6B

Next, FIGS. 18(a)-18(l) are a set of diagrams illustrating steps in a wiring board manufacturing method according to Embodiment 6B. Embodiment 6B will be described with reference to FIGS. 18(a)-18(l). Embodiment 6B is different from Embodiment 2B in that the laser modification step in Step 1 is performed after the support is bonded to the glass substrate 1. Therefore, Embodiment 6B is different from Embodiment 2B described above only in Step 1 and Step 6; Steps 2 to 5 and Steps 7 to 10 are the same as those described above, and thus overlapping description will be omitted.
(Step 1)

Alkali-free glass having a thickness of 130 µm is prepared, foreign matter on surfaces of the alkali-free glass is removed by ultrasonic cleaning or the like, and thus a glass substrate 1 is provided. Subsequently, as illustrated in FIG. 18(a), the glass substrate securing glass carrier 26 is bonded onto the surface 1b opposite to the first surface using the adhesive 25 for temporary bonding. The glass substrate securing glass carrier 26 desirably has a thickness in the range of 0.7 mm or more and 10 mm or less in view of the transportability thereof during machining. The thickness of the glass substrate securing glass carrier 26 may be set, as appropriate, according to the thickness of the glass substrate 1. The glass substrate securing glass carrier 26 is illustrated as the support, but the support is not required to be made of glass and may be made of a metal, a resin, or the like. Step X corresponds to Step 1 described above, but the disclosure of Step 1 does not limit Step X.
(Step 6)

As illustrated in FIG. 18(e), laser light is emitted from the surface 1b, which is opposite to the first surface 1a, of the glass substrate 1, and the laser-modified portion 2, which is a starting point of a through via, is formed (Step A). The amount of laser light is adjusted so that the laser-modified portion 2 extends from the surface 1b, which is opposite to the first surface, to the surface 1a, which is vertically opposite, for example, and that an end of the laser-modified portion 2 passes through the glass substrate 1 and is within the glass substrate securing glass carrier 26. The laser light used is the same as that used in Embodiment 1A. Subsequently, Step B of forming the first surface wiring layer as described above is performed.

Furthermore, as illustrated in FIG. 18(f), the glass substrate securing glass carrier 26 that has been temporarily bonded in Step 1 is removed (separated and removed), and the glass substrate 1 is exposed (Step Y). Next, using a hydrogen fluoride solution, etching is performed from the surface 1b of the glass substrate 1, which is located on the opposite side from the first surface wiring layer 11 (Step C). The surface 1b of the glass substrate 1 is etched using the hydrogen fluoride solution, so that the thickness thereof is reduced while the processed glass substrate 1 has a surface opposite which remains parallel with the first surface 1a of the glass substrate 1, as illustrated in FIG. 18(g). When the hydrogen fluoride solution comes into contact with the laser-modified portion 2, the laser-modified portion 2 is dissolved preferentially, and thus the through via 15 is formed. In this manner, the glass substrate 1 is reduced in thickness while the through via 15 is formed therein. In other words, the thickness of the glass substrate 1 is reduced and the through via 15 is formed in one etching process. The lower surface of the glass substrate 1 that has been reduced in thickness is the second surface 1b' on which a second surface wiring layer is to be formed. The through via 15 has a frustoconical shape with a diameter (or a cross-sectional area) on the second surface 1b' side greater than a diameter (or a cross-sectional area) on the first surface 1a side. Subsequently, the through via treatment step (Step D) and the through electrode formation step (Step E) are performed as described above.

Furthermore, depending on various etching conditions such as the modification position of the laser-modified portion, the concentration of the hydrogen fluoride solution, and the processing temperature, the cross-sectional shape of the through via 15 can be determined from among: (a) the shape of a letter V such that the diameter on the first surface 1a side is less than the diameter on the second surface 1b' side, as mentioned earlier; (b) the shape of a letter X such that a maximum cross-sectional area is provided on one of the first surface 1a side and the second surface 1b' side and a minimum cross-sectional area is provided at a distance of 0.4 T or more and T or less from the first surface 1a where T is the thickness of the glass substrate 1; and (c) the shape of a bottleneck such that a maximum cross-sectional area is provided on one of the first surface 1a side and the second surface 1b' side and a minimum cross-sectional area is provided at a distance of greater than 0 and 0.2 T or less from the first surface 1a where T is the thickness of the glass substrate 1, as illustrated in FIGS. 3(a)-3(c).

When the glass substrate 1 is formed on the glass substrate securing glass carrier 26, laser-modified portions are formed, and before the etching in which the hydrogen fluoride solution is used, the glass substrate securing glass carrier 26 is removed, the laser-modified portions 2 of the glass substrate 1 are formed for the entire depth, meaning that there is less variation in depth among the modified portions as compared to Embodiment 1B. Therefore, there is less variation in diameter among through vias that are formed after the etching in which the hydrogen fluoride solution is used, leading to improved machining accuracy.

Embodiment 7B

Next, Embodiment 7B of the present invention will be described. Embodiment 7B is different from Embodiment 5B described above only in Step 7 (step D); Steps 1 to 6 and Steps 8 to 10 are the same as those described above. Step 7 is the same as Step 7 according to Embodiment 3B. Thus, overlapping description will be omitted.

Embodiment 8B

Next, Embodiment 8B of the present invention will be described. Embodiment 8B is different from Embodiment 6B described above only in Step 7 (step D); Steps 1 to 6 and Steps 8 to 10 are the same as those described above. Step 7 is the same as Step 7 according to Embodiment 3B. Thus, overlapping description will be omitted.

(Comparison Test 1)

The inventors of the present invention calculated a resistance reduction rate with respect to each length of the through electrode at various etching rates for the hydrofluoric acid resistant metal film that is 500 nm-thick before etching. Table 1 shows the result.

TABLE 1

| LENGTH (μm) OF THROUGH ELECTRODE | RESISTANCE REDUCTION RATE (%) | | | |
| --- | --- | --- | --- | --- |
| | 0% ETCHING RATE | 40% ETCHING RATE | 70% ETCHING RATE | 100% ETCHING RATE |
| 100 | 0 | −1.2 | −2.2 | −3.2 |
| 80 | 0 | −1.5 | −2.7 | −3.9 |
| 60 | 0 | −2.0 | −3.6 | −5.3 |
| 50 | 0 | −2.4 | −4.3 | −6.3 |

The etching rate is a value indicated by $(1-B/A)\times 100$ where A is the thickness of the hydrofluoric acid resistant metal film before etching and B is the average thickness of the hydrofluoric acid resistant metal film after etching. The resistance reduction rate indicates, as a negative value, a percentage of decrease in the electrical resistance value at each etching rate where the value of electrical resistance between the first surface wiring layer and the second surface wiring layer which sandwich the through electrode at the 0% etching rate is 100.

The result in Table 1 shows that the resistance reduction effect increases as the etching rate increases from 0% regardless of the length of the through electrode. Furthermore, the result shows that the resistance reduction effect increases as the length of the through electrode is reduced.

Note that when the etching rate is below 50%, there is a risk that glass etching residues may be left on the hydrofluoric acid resistant metal film. Therefore, when the etching is to be performed, the etching rate is desirably set to 50% or more.

In Embodiment 1A illustrated in FIG. 6 (or Embodiment 3A, Embodiment 7A, or Embodiment 8A), the etching rate is 0% as in the comparative example illustrated in FIG. 9, but in the comparative example, since the glass etching residues are left on the hydrofluoric acid resistant metal film, the electrical resistance value is higher than that in Embodiment 1A. Furthermore, in Embodiment 2A illustrated in FIG. 8 (or Embodiment 5A, Embodiment 9A, Embodiment 11A, Embodiment 1B, Embodiment 2B, Embodiment 5B, or Embodiment 6B), the etching rate exceeds 0%, but is less than 100%. The etching rate is desirably set to 70% to 90% when the balance between the removal of the glass etching residues, the reduction in the number of processes in the wet etching process step, and the resistance reduction rate is taken into consideration.

In contrast, in Embodiment 4A illustrated in FIG. 13 (or Embodiment 6A, Embodiment 10A, Embodiment 12A, Embodiment 3B, Embodiment 4B, Embodiment 7B, or Embodiment 8B), the etching rate is 100%. The etching rate is desirably set to 100% when reaching a target resistance reduction rate is prioritized over a reduction in the number of processes in the dry etching process step. Note that when the etching rate is set to 100%, appropriate conditions such as time for the dry etching process step are desirably determined in advance through simulations, experiments, or the like in order to minimize damage to the copper film located on the back side of the hydrofluoric acid resistant metal film.

(Comparison Test 2)

The inventors of the present invention calculated rates of change of a Q factor of a MIM capacitor formed directly above the through via 15 or a solenoid coil that uses the through electrode 18 as a portion of wiring and rates of change of an S-parameter (S21) of a resonant frequency part of an LC filter including the MIM capacitor and the solenoid coil connected in series when various etching rates are applied to the hydrofluoric acid resistant metal film that is 500 nm-thick before etching. Note that the length of the through via is set to 100 μm. Table 2 shows the result.

TABLE 2

| ELEMENT | EVALUATION ITEM | 0% ETCHING RATE | 50% ETCHING RATE | 75% ETCHING RATE | 100% ETCHING RATE |
|---|---|---|---|---|---|
| CAPACITOR | Q FACTOR INCREASE RATE (%) | 0 | 0.1 | 0.7 | 4.5 |
| INDUCTOR |  | 0 | 1.1 | 8.7 | 16.4 |
| LC FILTER | S$_{21}$ VALUE REDUCTION RATE (%) OF RESONANT FREQUENCY | 0 | −0.1 | −0.3 | −0.6 |

The Q factor increase rate indicates, as a positive value, a percentage of increase in the Q factor at each etching rate where the Q factor of each of the MIM capacitor and the solenoid coil at the 0% etching rate is 100. The S21 value reduction rate indicates, as a negative value, a percentage of decrease in the S-parameter (S21) value at each etching rate where the S-parameter (S21) value of the LC filter at the resonant frequency is 100.

The result in Table 2 shows that the Q factor increase effects of the MIM capacitor and the solenoid coil increase as the etching rate increases from 0%. Furthermore, the result also shows that as the etching rate increases from 0%, the S-parameter (S21) value of the LC filter decreases, exhibiting sharp filter characteristics.

Note that when the etching rate is below 50%, there is a risk that glass etching residues may be left on the hydrofluoric acid resistant metal film. Therefore, the etching rate is desirably set to 50% or more.

In the comparative example illustrated in FIG. 6, the etching rate is 0%. In contrast, in Embodiment 2A illustrated in FIG. 8 (or Embodiment 5A, Embodiment 9A, Embodiment 11A, Embodiment 1B, Embodiment 2B, Embodiment 5B, or Embodiment 6B), the etching rate exceeds 0%, but is less than 100%. The etching rate is desirably set to 70% to 90% when the balance between the removal of the glass etching residues, the reduction in the number of processes in the wet etching process, and the resistance reduction rate is taken into consideration.

In contrast, in Embodiment 4A illustrated in FIG. 13 (or Embodiment 6A, Embodiment 10A, Embodiment 12A, Embodiment 3B, Embodiment 4B, Embodiment 7B, or Embodiment 8B), the etching rate is 100%. The etching rate is desirably set to 100% when reaching a target resistance reduction rate is prioritized over a reduction in the number of processes in the wet etching process. Note that when the etching rate is set to 100%, appropriate conditions such as a treatment solution, time, etc., for the wet etching process are desirably determined in advance through simulations, experiments, or the like in order to minimize damage to the copper film located on the back side of the hydrofluoric acid resistant metal film.

(Comparison Test 3)

The inventors of the present invention prepared 20 wiring boards according to Embodiment 1A (Example 1) and 20 wiring boards in each of which the through via has substantially the same diameters on the first surface side and the second surface side (Comparative Example 1). Example 1 and Comparative Example 1 are different only in the shape of the through via while sharing the other manufacturing process and structure.

When continuity tests were conducted on the through electrodes in Example 1 and Comparative Example 1, approximately 10% of the test results in Comparative Example 1 were conduction failures. In contrast, conduction failures in Example 1 were as low as 0.5% or less. This is because the through via in Example 1 has a frustoconical shape with a smaller diameter on the first surface side and therefore, at the time of forming the seed layer in the through via by sputtering, for example, particles of the film-forming material are likely to adhere to the inner periphery and the bottom of the through via. This result makes it clear that other embodiments in each of which the through via has a frustoconical shape also have the advantageous effect of reducing conduction failures.

(Comparison Test 4)

The inventors of the present invention prepared 20 wiring boards according to Embodiment 1A (Example 2) and 20 wiring boards in each of which the seed layer 4 is brought into direct contact with the glass substrate without using the hydrofluoric acid resistant metal film 3 (Comparative Example 2). Example 2 and Comparative Example 2 share the manufacturing process and the structure other than the presence or absence of the hydrofluoric acid resistant metal film.

In Example 2 and Comparative Example 2, cross-cut tests were conducted, and rates of separation (n/100) of the seed layer 4 were calculated. As a result, separation of the seed layer 4 was found in 25% of the wiring boards that do not include the hydrofluoric acid resistant metal film 3. In contrast, in the present embodiment, the seed layer 4 was not separated (the rate of separation: 0%), which shows that the hydrofluoric acid resistant metal film 3 is effective in reducing the separation of the seed layer 4. This result makes it clear that even in other embodiments, the hydrofluoric acid resistant metal film 3 is effective in reducing the separation of the seed layer 4.

(Comparison Test 5)

The inventors of the present invention prepared 50 wiring boards according to Embodiment 2A and Embodiment 1B as Example 3 (70% etching rate), 50 wiring boards according to Embodiment 4A and Embodiment 3B as Example 4 (100% etching rate), and 50 wiring boards each of which is illustrated in FIG. 6 as Comparative Example 3 (0% etching rate), attached these to a thermal shock tester, and conducted comparison tests.

In such comparison tests, assuming that one cycle includes variations in the ambient temperature for the wiring boards in the range of −40° C. to +125° C., this cycle was repeated 1,000 times, and then the conduction of the through vias was checked. As a result, conduction failures occurred in 30% of the wiring boards according to Comparative Example 3, while conduction failures occurred in only about 5% of the wiring boards with a 70% etching rate. This is because sputtering improves the throwing power of a film-forming material at the bottom of the through via, allowing for reduced formation of defects such as voids in the seed layer 16, meaning that the strong seed layer 16 can reduce separation between the hydrofluoric acid resistant metal film 3 and the glass substrate 1.

Furthermore, conduction failures occurred in as low as 2% of the wiring boards with the 100% etching rate. This is because, in the case of the wiring boards with the 100% etching rate, as compared to the wiring boards with an etching rate less than 100%, the seed layer is formed in the state where the hydrofluoric acid resistant metal film having a relatively high resistivity has been completely removed, and therefore all (most) of the connecting parts on the front and back of the through via part have the same material, meaning that the reliability of connection of the through via part is improved and the transmission characteristics and the electrical characteristics are further improved. Note that it is obvious that because of the same structural features, the results of experiments according to Example 3 can be applied to Embodiment 5A, Embodiment 9A, Embodiment 11A, Embodiment 2B, Embodiment 5B, and Embodiment 6B, and the results of experiments according to Example 4 can be applied to Embodiment 6A, Embodiment 10A, Embodiment 12A, Embodiment 4B, Embodiment 7B, and Embodiment 8B.

(First Invention Group)

A wiring board according to one aspect of the present invention is characterized by including:
- a MIM capacitor including a lower electrode, a dielectric layer, and an upper electrode, the lower electrode including a hydrofluoric acid resistant metal film and a copper layer formed on a first surface of a glass substrate, the dielectric layer being formed on the lower electrode, the upper electrode being formed on the dielectric layer;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the lower electrode and the second surface wiring layer, wherein
- the hydrofluoric acid resistant metal film is etched from the through via perpendicularly to the first surface.

A wiring board according to one aspect of the present invention is characterized by including:
- a first surface wiring layer including a hydrofluoric acid resistant metal film and a copper layer, the hydrofluoric acid resistant metal film and the copper layer being formed on a first surface of a glass substrate;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the first surface wiring layer and the second surface wiring layer, wherein
- the first surface wiring layer, the through electrode, and the second surface wiring layer form a solenoid coil, and
- the hydrofluoric acid resistant metal film is etched from the through via perpendicularly to the first surface.

A wiring board according to one aspect of the present invention is characterized by including:
- a MIM capacitor including a first surface wiring layer, a lower electrode, a dielectric layer, and an upper electrode, the first surface wiring layer and the lower electrode including a hydrofluoric acid resistant metal film and a copper layer formed on a first surface of a glass substrate, the dielectric layer being formed on the lower electrode, the upper electrode being formed on the dielectric layer;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the first surface wiring layer or the lower electrode and the second surface wiring layer, wherein
- the first surface wiring layer, the through electrode, and the second surface wiring layer form a solenoid coil,
- the MIM capacitor and the solenoid coil form an LC filter, and
- the hydrofluoric acid resistant metal film is etched from the through via perpendicularly to the first surface.

A wiring board according to one aspect of the present invention is characterized by including:
- a first surface wiring layer including a hydrofluoric acid resistant metal film and a copper layer, the hydrofluoric acid resistant metal film and the copper layer being formed on a first surface of a glass substrate;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the first surface wiring layer and the second surface wiring layer, wherein
- the hydrofluoric acid resistant metal film is etched from the through via perpendicularly to the first surface, and
- the through via includes the through electrode only.

A wiring board according to one aspect of the present invention is characterized by including:
- a first surface wiring layer including a hydrofluoric acid resistant metal film and a copper layer, the hydrofluoric acid resistant metal film and the copper layer being formed on a first surface of a glass substrate;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the first surface wiring layer and the second surface wiring layer, wherein
- the hydrofluoric acid resistant metal film is etched from the through via perpendicularly to the first surface, and through via.

the through via includes the through electrode and an insulating resin filling the

(Second Invention Group)

A wiring board according to one aspect of the present invention is characterized by including:
- a MIM capacitor including a lower electrode, a dielectric layer, and an upper electrode, the lower electrode including a hydrofluoric acid resistant metal film and a copper layer formed on a first surface of a glass substrate, the dielectric layer being formed on the lower electrode, the upper electrode being formed on the dielectric layer;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the lower electrode and the second surface wiring layer, wherein
- the hydrofluoric acid resistant metal film includes an undercut at a position between the through via and the hydrofluoric acid resistant metal film.

A wiring board according to one aspect of the present invention is characterized by including:
- a first surface wiring layer including a hydrofluoric acid resistant metal film and a copper layer, the hydrofluoric acid resistant metal film and the copper layer being formed on a first surface of a glass substrate;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the first surface wiring layer and the second surface wiring layer, wherein
- the first surface wiring layer, the through electrode, and the second surface wiring layer form a solenoid coil, and
- the hydrofluoric acid resistant metal film includes an undercut at a position between the through via and the hydrofluoric acid resistant metal film.

A wiring board according to one aspect of the present invention is characterized by including:
- a MIM capacitor including a first surface wiring layer, a lower electrode, a dielectric layer, and an upper electrode, the first surface wiring layer and the lower electrode including a hydrofluoric acid resistant metal film and a copper layer formed on a first surface of a glass substrate, the dielectric layer being formed on the lower electrode, the upper electrode being formed on the dielectric layer;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the first surface wiring layer or the lower electrode and the second surface wiring layer, wherein
- the first surface wiring layer, the through electrode, and the second surface wiring layer form a solenoid coil, the MIM capacitor and the solenoid coil form an LC filter, and
- the hydrofluoric acid resistant metal film includes an undercut at a position between the through via and the hydrofluoric acid resistant metal film.

A wiring board according to one aspect of the present invention is characterized by including:
- a first surface wiring layer including a hydrofluoric acid resistant metal film and a copper layer, the hydrofluoric acid resistant metal film and the copper layer being formed on a first surface of a glass substrate;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the first surface wiring layer and the second surface wiring layer, wherein
- the hydrofluoric acid resistant metal film includes an undercut at a position between the through via and the hydrofluoric acid resistant metal film, and
- the through via includes the through electrode only.

A wiring board according to one aspect of the present invention is characterized by including:
- a first surface wiring layer including a hydrofluoric acid resistant metal film and a copper layer, the hydrofluoric acid resistant metal film and the copper layer being formed on a first surface of a glass substrate;
- a second surface wiring layer formed on a second surface of the glass substrate, the second surface being an opposite surface to the first surface;
- a through via connecting the first surface and the second surface and extending to the hydrofluoric acid resistant metal film; and
- a through electrode formed in the through via and connecting the first surface wiring layer and the second surface wiring layer, wherein
- the hydrofluoric acid resistant metal film includes an undercut at a position between the through via and the hydrofluoric acid resistant metal film, and through via.
- the through via includes the through electrode and an insulating resin filling the through via.

REFERENCE SIGNS LIST

1 . . . Glass substrate; 2 . . . Laser-modified portion; 3 . . . Hydrofluoric acid resistant metal film; 4 . . . Seed layer; 5 . . . Copper layer; 6 . . . Lower electrode; 7 . . . Dielectric; 8 . . . Upper electrode; 9 . . . Insulating resin; 10 . . . Solder resist; 11 . . . First surface wiring layer; 12 . . . External connection terminal; 13 . . . Adhesive; 14 . . . Glass carrier; 15 . . . Through via; 16 . . . Seed layer; 17 . . . Copper layer; 18 . . . Through electrode; 19 . . . Second surface wiring layer; 20 . . . Wiring board; 21 . . . Solder ball; 22 . . . Semiconductor chip; 23 . . . Chip component; 24 . . . High-frequency device; 25 . . . Adhesive; 26 . . . Glass substrate securing glass carrier; 27 . . . Wiring; GER . . . Etching residue; UC . . . Undercut.

What is claimed is:

1. A wiring board manufacturing method, comprising the steps of:
    a step A of forming a laser-modified portion in a glass substrate by applying laser light to the glass substrate from a first surface toward an opposite surface thereof;
    a step B of forming, on the first surface of the glass substrate, a first surface wiring layer including a hydrofluoric acid resistant metal film and a copper layer;
    a step C of etching a surface of the glass substrate opposite to the first surface to form a through via in the laser-modified portion and form a second surface of the glass substrate, the second surface being an opposite surface to the first surface;
    a through via treatment step D of removing an etching residue of glass adhered to the hydrofluoric acid resistant metal film; and
    a step E of forming a through electrode in the through via, wherein
    in the through via treatment step D, a dry etching process or a wet etching process is performed to remove the etching residue of glass adhered to the hydrofluoric acid resistant metal film and remove a portion of the hydrofluoric acid resistant metal film.

2. The wiring board manufacturing method of claim 1, wherein
    in the through via treatment step D, the dry etching process or the wet etching process is performed to remove the etching residue of glass adhered to the hydrofluoric acid resistant metal film and remove the portion of the hydrofluoric acid resistant metal film until a through-hole is formed therein.

3. The wiring board manufacturing method of claim 1, wherein
    the step A is performed before or after the step B.

4. The wiring board manufacturing method of claim 1, wherein
    in the through via treatment step D, a seed layer is formed on the through via by sputtering or electroless plating.

5. A wiring board manufacturing method, comprising the steps of:
    a step X of bonding a glass substrate to a support;
    a step A of forming a laser-modified portion in the glass substrate and the support by applying laser light thereto from a first surface toward an opposite surface of each of the glass substrate and the support;
    a step B of forming, on the first surface of the glass substrate, a first surface wiring layer including a hydrofluoric acid resistant metal film and a copper layer;
    a step Y of separating and removing the support;
    a step C of etching a surface of the glass substrate opposite to the first surface to form a through via in the laser-modified portion and form a second surface of the glass substrate, the second surface being an opposite surface to the first surface;
    a through via treatment step D of removing an etching residue of glass adhered to the hydrofluoric acid resistant metal film; and
    a step E of forming a through electrode in the through via.

6. A wiring board, comprising:
    a first surface wiring layer including a hydrofluoric acid resistant metal film and a copper layer, the hydrofluoric acid resistant metal film and the copper layer being formed on a first surface of a glass substrate;
    a second surface wiring layer formed on a second surface of the glass substrate, the second surface being an opposite surface to the first surface;
    a through via connecting the first surface and the second surface and extending to the hydrofluoric acid resistant metal film; and
    a through electrode formed in the through via and connecting the first surface wiring layer and the second surface wiring layer, wherein
    the hydrofluoric acid resistant metal film is etched from the through via perpendicularly to the first surface or etched from the through via so as to include an undercut.

7. The wiring board of claim 6, further comprising:
    a MIM capacitor including a lower electrode, a dielectric layer, and an upper electrode, the lower electrode including the hydrofluoric acid resistant metal film and the copper layer formed on the first surface of the glass substrate, the dielectric layer being formed on the lower electrode, the upper electrode being formed on the dielectric layer.

8. The wiring board of claim 6, wherein
    the first surface wiring layer, the through electrode, and the second surface wiring layer form a solenoid coil.

9. The wiring board of claim 6, wherein
    an LC filter is formed of:
    a MIM capacitor including a first surface wiring layer, a lower electrode, a dielectric layer, and an upper electrode, the first surface wiring layer and the lower electrode including the hydrofluoric acid resistant metal film and the copper layer formed on the first surface of the glass substrate, the dielectric layer being formed on the lower electrode, the upper electrode being formed on the dielectric layer; and
    a solenoid coil formed of the first surface wiring layer, the through electrode, and the second surface wiring layer.

10. The wiring board of claim 6, wherein
    the through electrode does not penetrate the hydrofluoric acid resistant metal film.

11. The wiring board of claim 6, wherein
    the through electrode penetrates the hydrofluoric acid resistant metal film and is connected to the copper layer.

12. The wiring board of claim 6, wherein
    the through via includes the through electrode only.

13. The wiring board of claim 6, wherein
    the through via includes the through electrode and an insulating resin filling the through via.

14. The wiring board of claim 6, wherein
    the through via decreases in diameter from the second surface toward the first surface.

15. The wiring board of claim 6, wherein
    the through via has a maximum cross-sectional area at one of an end on the first surface and an end on the second surface, and has a minimum cross-sectional area at a distance of 0.4 T or more and 0.6 T or less from the first surface where T is a thickness of the glass substrate.

16. The wiring board of claim 6, wherein
    the through via has a maximum cross-sectional area at one of an end on the first surface and an end on the second surface, and has a minimum cross-sectional area at a distance of greater than 0 and 0.2 T or less from the first surface where T is a thickness of the glass substrate.

17. The wiring board of claim 6, wherein
    the hydrofluoric acid resistant metal film is made of at least one of chromium, nickel, and nickel-chromium.

* * * * *